(12) United States Patent
Oyama

(10) Patent No.: US 8,259,505 B2
(45) Date of Patent: Sep. 4, 2012

(54) NONVOLATILE MEMORY DEVICE WITH REDUCED CURRENT CONSUMPTION

(75) Inventor: Kazuhiko Oyama, Fukuoka (JP)

(73) Assignee: NSCore Inc., Fukuoka (JP)

( * ) Notice: Subject to any disclaimer, the term of this patent is extended or adjusted under 35 U.S.C. 154(b) by 229 days.

(21) Appl. No.: 12/789,522

(22) Filed: May 28, 2010

(65) Prior Publication Data

US 2011/0292735 A1   Dec. 1, 2011

(51) Int. Cl.
  G11C 16/04    (2006.01)
  G11C 7/02    (2006.01)

(52) U.S. Cl. ............. 365/185.2; 365/185.21; 365/210.1; 365/210.14

(58) Field of Classification Search ............... 365/210.1, 365/185.2
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,289,412 A * | 2/1994 | Frary et al. | 365/185.21 |
| 5,642,308 A * | 6/1997 | Yoshida | 365/185.12 |
| 5,886,925 A * | 3/1999 | Campardo et al. | 365/185.21 |
| 5,917,753 A * | 6/1999 | Dallabora et al. | 365/185.21 |
| 5,956,269 A | 9/1999 | Ouyang et al. | |
| 6,016,276 A * | 1/2000 | Fuji | 365/189.07 |
| 6,038,168 A | 3/2000 | Allen et al. | |
| 6,064,590 A | 5/2000 | Han et al. | |
| 6,207,507 B1 * | 3/2001 | Wang | 438/267 |
| 6,363,015 B1 * | 3/2002 | Barcella et al. | 365/185.21 |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizin et al. | |
| 2004/0232477 A1 | 11/2004 | Iwata et al. | |
| 2004/0252554 A1 | 12/2004 | Fournel et al. | |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | WO2006/093629 | 9/2006 |

* cited by examiner

Primary Examiner — Son Mai
(74) Attorney, Agent, or Firm — IPUSA, PLLC

(57) ABSTRACT

A nonvolatile memory device includes one or more reference cell transistors, one or more memory cell transistors, and a current source circuit including three or more field effect transistors that have gates thereof connected together, the three or more field effect transistors including two or more field effect transistors and another field effect transistor, currents flowing through the two or more field effect transistors being combined to flow through the one or more reference cell transistors, and another field effect transistor having a drain thereof connected to one of the one or more memory cell transistors.

12 Claims, 30 Drawing Sheets

FIG.25

| WE | REVERSEOUT | DIN | IO |
|---|---|---|---|
| L | L | L | Hi-Z |
| L | L | H | Hi-Z |
| L | H | L | Hi-Z |
| L | H | H | Hi-Z |
| H | L | L | VPP |
| H | L | H | VSS |
| H | H | L | VSS |
| H | H | H | VDD |

NONVOLATILE MEMORY DEVICE WITH REDUCED CURRENT CONSUMPTION

BACKGROUND OF THE INVENTION

1. Field of the Invention

The disclosures herein generally relate to memory devices, and particularly relate to a nonvolatile memory device.

2. Description of the Related Art

There are various types of nonvolatile memory devices. Conventionally, a nonvolatile memory cell requires a special structure such as a floating gate or a special material such as a ferroelectric material for the purpose of achieving nonvolatile data retention. There is a new type of nonvolatile memory device known as a PermSRAM, which uses an MIS (metal-insulating film-semiconductor) transistor as a nonvolatile memory cell. In this type of nonvolatile memory device, data is written to an MIS transistor by deliberately causing electrons to be trapped in an insulator layer or sidewalls through the hot-carrier effect.

Some types of nonvolatile memory devices employ a memory cell through which an electric current flows during a data read operation. In such nonvolatile memory devices, a current sense circuit compares a current flowing through an accessed memory cell with a current flowing through a reference cell. A data value read from the accessed memory cell is determined based on the result of the comparison. A cell current flowing through an accessed memory cell that stores "0" may be smaller than a reference current flowing through the reference cell. A cell current flowing through an accessed memory cell that stores "1" may be larger than the reference current.

A large cell current flows through each of the accessed memory cells that stores "1". The number of memory cells accessed at a time is equal to the number of bits for data input/output. When the data bit width is 32, for example, the total amount of currents flowing through the accessed memory cells can reach 32 times the amount of the large cell current. Such a large current consumption may not be desirable when considering a demand for reduced power consumption.

SUMMARY OF THE INVENTION

It is a general object of the present invention to provide a nonvolatile memory device that can avoid large current consumption associated with a data read operation.

According to one aspect, the invention provides a nonvolatile memory device including one or more reference cell transistors, one or more memory cell transistors, and a current source circuit including three or more field effect transistors that have gates thereof connected together, the three or more field effect transistors including two or more field effect transistors and another field effect transistor, currents flowing through the two or more field effect transistors being combined to flow through the one or more reference cell transistors, and another field effect transistor having a drain thereof connected to one of the one or more memory cell transistors.

According to another aspect, a method of reading data from a memory cell transistor in a nonvolatile memory device includes the steps of causing a first amount of current to flow through a reference cell transistor, utilizing a field effect transistor as a constant current source in order to supply a second amount of current to the memory cell transistor, the second amount being smaller than and proportional to the first amount, and detecting a voltage at a drain of the field effect transistor to sense the data.

Other objects and further features of the present invention will be apparent from the following detailed description when read in conjunction with the accompanying drawings.

BRIEF DESCRIPTION OF THE DRAWINGS

FIG. 25 is a drawing showing a logic table defining the operation of the write buffer illustrated in FIG. 24.

DESCRIPTION OF THE PREFERRED EMBODIMENTS

In the following, embodiments of the present invention will be described with reference to the accompanying drawings.

Figure 1:
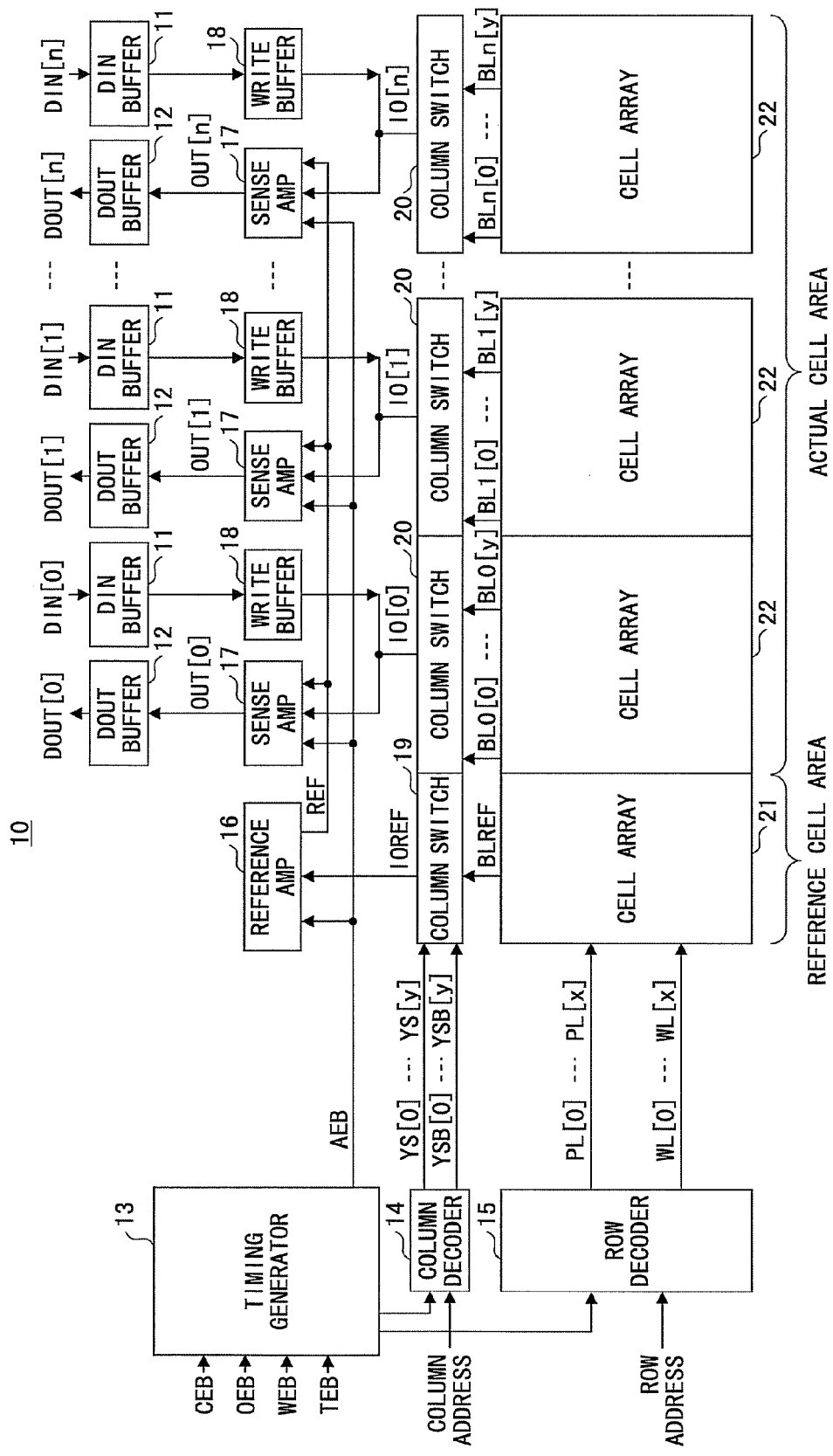
FIG. 1 is a block diagram showing the configuration of a nonvolatile semiconductor memory device according to a first embodiment.

FIG. 1 is a block diagram showing the configuration of a nonvolatile semiconductor memory device according to a first embodiment. A nonvolatile memory device 10 shown in FIG. 1 includes DIN buffers 11, DOUT buffers 12, a timing generator 13, a column decoder 14, a row decoder 15, a reference amplifier 16, sense amplifiers 17, write buffers 18, a column switch 19, column switches 20, a cell array 21, and cell arrays 22. The number of bits for data input/output is n+1 in this example. The DIN buffers 11, the DOUT buffers 12, the sense amplifiers 17, the write buffers 18, the column switches 20, and the cell arrays 22 are provided in one-to-one correspondence to the respective input/output bits.

The timing generator 13 receives a chip enable signal CEB, an output enable signal DEB, a write enable signal WEB, and a test enable signal TEB from an external device. All of these control signals are asserted at LOW and negated at HIGH, for example. The chip enable signal CEB is asserted to activate the nonvolatile memory device 10. The output enable signal OEB is asserted to activate a data read operation. The write enable signal WEB is asserted to activate a data write operation. The test enable signal is asserted to activate a test operation. The timing generator 13 generates various timing signals and control signals for provision to various parts of the nonvolatile memory device 10 to control the operation of the nonvolatile memory device 10. One of such control signals is an amplifier enable signal AEB, which is asserted at LOW and negated at HIGH, for example. The amplifier enable signal AEB is applied to the reference amplifier 16 and the sense amplifiers 17.

Column address signals indicative of a column address to be accessed are applied to the column decoder 14 from an external source. The column decoder 14 produces column select signals YS[0] through YS[y] and YSB[0] through YSB[y]. The column select signals YS[0] through YS[y] and the column select signals YSB[0] through YSB[y] are complementary to each other. The column decoder 14 decodes the column address signals to activate one of the column select signals YS[0] through YS[y] and one of the column select signals YSB[0] through YSB[y] to specify a column to be accessed.

Row address signals indicative of a row address to be accessed are applied to the row decoder 15 from an external source. The row decoder 15 drives word lines WL[0] through WL[x] and plate lines PL[0] through PL[x]. The row decoder 15 decodes the row address signals to activate one of the word lines WL[0] through WL[x] and one of the plate lines PL[0] through PL[x].

Input data DIN[0] through DIN[n] are applied to the respective DIN buffers 11 for a data write operation from an external device. The input data is supplied from the DIN buffers 11 to the write buffers 18 for amplification. The write buffers 18 supply the amplified input data to the cell arrays 22 through the column switches 20.

Each of the cell arrays 22 includes a plurality of memory cells arranged in x+1 rows and y+1 columns. The memory cells may be flash memory transistors or MIS transistors, for example. The y+1 bit lines for the m-th input/output bit are illustrated as bit lines BLm[0] through BLm[y]. The column switches 20 select one of the bit lines BLm[0] through BLm[y] in response to the column select signals YS[0] through YS[y] and YSB[0] through YSB[y]. The m-th bit of input data supplied from the write buffers 18 is then applied to the selected one of the bit lines BLm[0] through BLm[y]. The same operation is performed for each bit of the input data. The row decoder 15 activates one of the word lines WL[0] through WL[x] and one of the plate lines PL[0] through PL[x] to select a row of memory cells to which the input data is written in each of the cell arrays 22.

During a data read operation, the row decoder 15 activates one of the word lines WL[0] through WL[x] to select a row of memory cells from which data is read. With respect to the m-th bit of the read data, the column switches 20 select one of the bit lines BLm[0] through BLm[y] in response to the column select signals YS[0] through YS[y] and YSB[0] through YSB[y]. The selected one of the bit lines BLm[0] through BLm[y] is coupled to the corresponding one of the sense amplifiers 17. The same operation is performed for each bit of the read data. The sense amplifiers 17 compare cell currents flowing through the accessed memory cells with a reference current flowing through a reference cell situated in the cell array 21. Read data OUT[0] through OUT[n] whose respective bit values are sensed by the sense amplifiers 17 are then supplied to the DOUT buffers 12. The DOUT buffers 12 output the read data OUT[0] through OUT[n] as output data DOUT[0] through DOUT[n] to outside the nonvolatile memory device 10.

Figure 2:
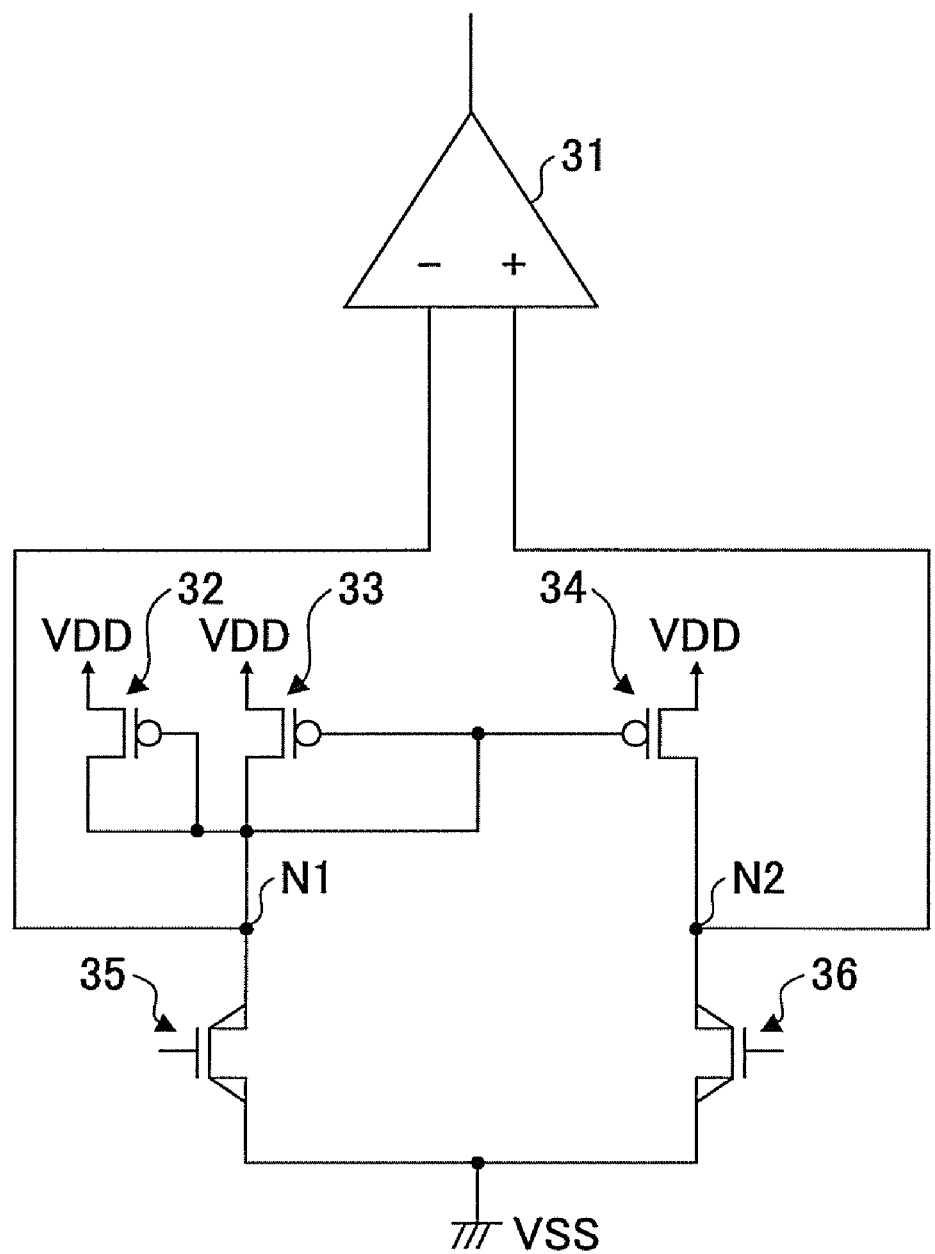
FIG. 2 is a drawing illustrating a circuit configuration for sensing a cell current.

FIG. 2 is a drawing illustrating a circuit configuration for sensing a cell current. The circuit illustrated in FIG. 2 includes an amplifier 31, PMOS transistors 32 through 34, a reference cell transistor 35, and a memory cell transistor 36. The reference cell transistor 35 and the memory cell transistor 36 are designed to be identical to each other, and are thus supposed to have identical characteristics in the initial state. Upon writing data "0" to the memory cell transistor 36, the threshold voltage of the memory cell transistor 36 increases. Namely, the amount of a cell current flowing through the memory cell transistor 36 is smaller than the amount of a cell current flowing through the reference cell transistor 35 if the same gate potential is applied.

Figure 3:
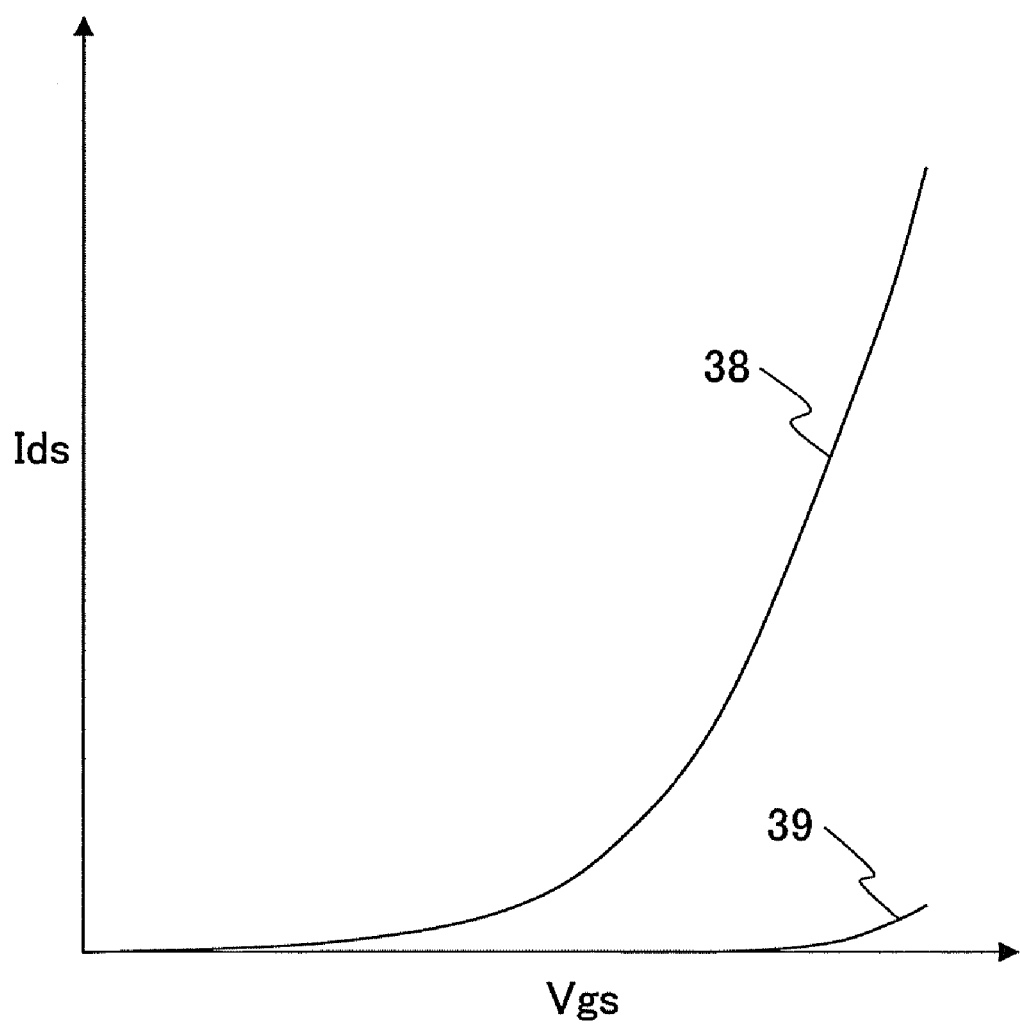
FIG. 3 is a drawing illustrating the characteristics of a memory cell current.

FIG. 3 is a drawing illustrating the characteristics of a memory cell current. The horizontal axis represents a gate-source voltage Vgs, which may be a voltage between the gate and source of the memory cell transistor 36 illustrated in FIG. 2. The vertical axis represents a drain-source current Ids, which may be a current flowing through the channel between the drain and source of the memory cell transistor 36. A characteristic curve represents the relationship between Vgs and Ids of a memory cell transistor in the initial state before "0" is written. A characteristic curve 39 represents the relationship between Vgs and Ids of a memory cell transistor after "0" is written. In a case of flash memory, "0" is written by causing electrons to be trapped in the floating gate. In a case of PermSRAM, "0" is written by causing hot carriers to be trapped in an insulating layer or sidewalls. As is illustrated in FIG. 3, the threshold voltage of the memory cell transistor that stores "0" is higher than the threshold voltage of the memory cell transistor that stores "1". That is, the cell current of the memory cell transistor that stores "0" is smaller than the cell current of the memory cell transistor that stores "1".

Referring to FIG. 2 again, the PMOS transistors 32, 33, and 34 have the gates thereof connected to each other, and have the sources thereof connected to a power supply voltage VDD (upward arrows indicate coupling to VDD). The drains of the PMOS transistors 32 and 33 are connected to the drain of the reference cell transistor 35 and to the gates of the PMOS transistors 32 and 33. The source of the reference cell transistor 35 is connected to a ground voltage VSS (the hatched symbol indicates VSS). When the high voltage VDD is applied to the gate of the reference cell transistor 35, the voltage at a node N1 is set such that the saturation current flows through the reference cell transistor 35, and such that the sum of the currents flowing through the PMOS transistors 32 and 33 as determined by the voltage at the node N1 is equal to the saturation current. Each of the PMOS transistors 32 and 33 thus causes half the saturation current to flow therethrough. The PMOS transistor 34 has the same gate potential as the PMOS transistors 32 and 33. The PMOS transistor 34 thus causes half the saturation current to flow therethrough.

Figure 4:
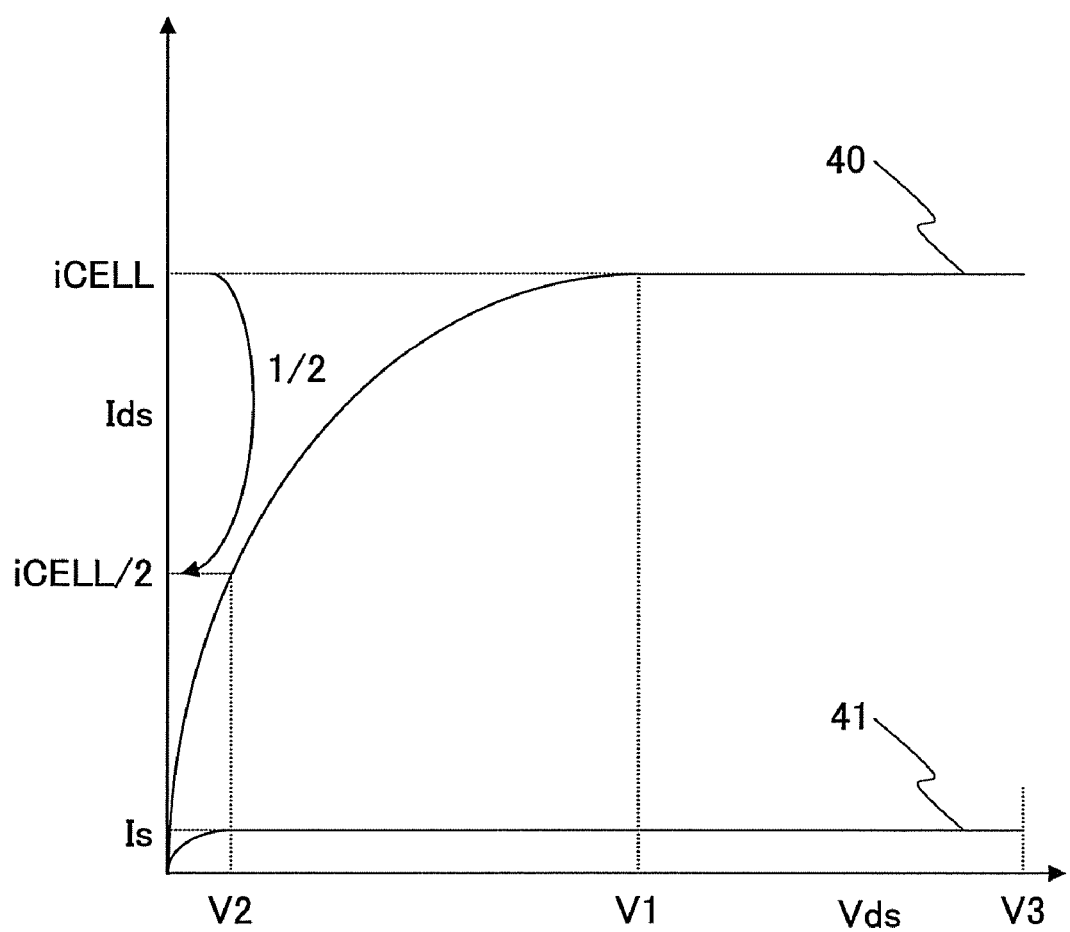
FIG. 4 is a drawing illustrating a drain-source voltage of a memory cell transistor.

FIG. 4 is a drawing illustrating a drain-source voltage of a memory cell transistor. The horizontal axis represents, a drain-source voltage Vds, which is a voltage between the gate and source of a cell transistor. The vertical axis represents a drain-source current Ids, which is a current flowing through the channel between the drain and source of a cell transistor. A characteristic curve 40 represents the relationship between Vds and Ids of the memory cell transistor 36 illustrated in FIG. 2 in the initial state before "0" is written. This characteristic curve 40 also represents the relationship between Vds and Ids of the reference cell transistor 35. A characteristic curve 41 represents the relationship between Vds and Ids of the memory cell transistor 36 after "0" is written. The gate voltage is assumed to be the same for these characteristic curves 40 and 41. A voltage V1 illustrated in FIG. 4 represents a voltage that causes a saturation current iCELL to flow through the reference cell transistor 35. Namely, the voltage V1 may be the voltage at the node N1 illustrated in FIG. 2.

Referring to FIG. 2 again, a description will now be given of a case in which the memory cell transistor 36 stores "1". In this case, the memory cell transistor 36 has the Vgs-Ids characteristic curve 38 illustrated in FIG. 3 and the Vds-Ids characteristic curve 40 illustrated in FIG. 4. When the same high voltage VDD that is applied to the gate of the reference cell transistor 35 is applied to the gate of the memory cell transistor 36, the current flowing through the memory cell transistor 36 can be as large as the saturation current of the reference cell transistor 35. Since the PMOS transistor 34 allows only half the saturation current to flow, the drain voltage of the memory cell transistor 36 at a node N2 is set such that the drain-source voltage Vds of the memory cell transistor 36 allows half the saturation current to flow through the memory cell transistor 36. A voltage V2 illustrated in FIG. 4 represents such a voltage at the node N2, which allows half the saturation current iCELL/2 to flow through the memory cell transistor 36. It should be noted that the ground voltage VSS is assumed to be zero in this case. In FIG. 2, the amplifier 31 compares the voltage V1 at the node N1 and the voltage V2 at the node N2, or amplifies a difference between the voltage V1 at the node N1 and the voltage V2 at the node N2. As the voltage V2 at the node N2 is smaller than the voltage V1 at the node N1, the output of the amplifier 31 is set to HIGH (i.e., VDD), representing "1".

Referring to FIG. 2 again, a description will be given of a case in which the memory cell transistor 36 stores "0". In this case, the memory cell transistor 36 has the Vgs-Ids characteristic curve 39 illustrated in FIG. 3 and the Vds-Ids characteristic curve 41 illustrated in FIG. 4. When the same high voltage VDD that is applied to the gate of the reference cell transistor 35 is applied to the gate of the memory cell transistor 36, the current flowing through the memory cell transistor 36 can only be as large as a saturation current Is of the characteristic curve 41. The PMOS transistor on the other hand tries to cause half the saturation current iCELL/2 to flow. Since only Is can flow, the voltage at the node N2 rises to reduce the source-drain voltage of the PMOS transistor 34. The voltage at the node N2 is set such that the drain-source voltage Vds of the PMOS transistor 34 allows the saturation current Is to flow through the PMOS transistor 34. A voltage V3 illustrated in FIG. 4 may represent such a voltage at the node N2, which allows the saturation current Is to flow through the PMOS transistor 34 and the memory cell transistor 36. In FIG. 2, the amplifier 31 compares the voltage V1 at the node N1 and the voltage V3 at the node N2, or amplifies a difference between the voltage V1 at the node N1 and the voltage V3 at the node N2. As the voltage V3 at the node N2 is larger than the voltage V1 at the node N1, the output of the amplifier 31 is set to LOW (i.e., VSS), representing "0".

As can be understood from the above description, the voltage V2 at the node N2 in the case of reading "1" is a voltage that causes the memory cell transistor 36 to operate in a linear region and to produce half the saturation current. Such a voltage V2 is smaller than half the gate-source voltage. Namely, the voltage V2 is smaller than half the power supply voltage VDD, and may be substantially close to the ground voltage VSS. Further, the voltage V3 at the node N2 in the case of reading "0" is commensurate with the amount of electrons trapped in the memory cell transistor. A sufficient amount of trapped electrons ensures that the voltage V3 be substantially close to the power supply voltage VDD. Under proper conditions, therefore, the voltage at the node N2 can be used as a sensed signal without using the signal amplification function of the amplifier 31.

The example illustrated in FIG. 2 causes a current equal in amount to half the saturation current of the reference cell transistor 35 to be supplied to the memory cell transistor 36. This is intended to be a non-limiting example. The amount of current that is supplied to the memory cell transistor 36 may be larger or smaller than half the saturation current, such as one-third the saturation current. The smaller the amount of current supplied to the memory cell transistor 36, the smaller the current consumption during a read operation is.

Figure 5:
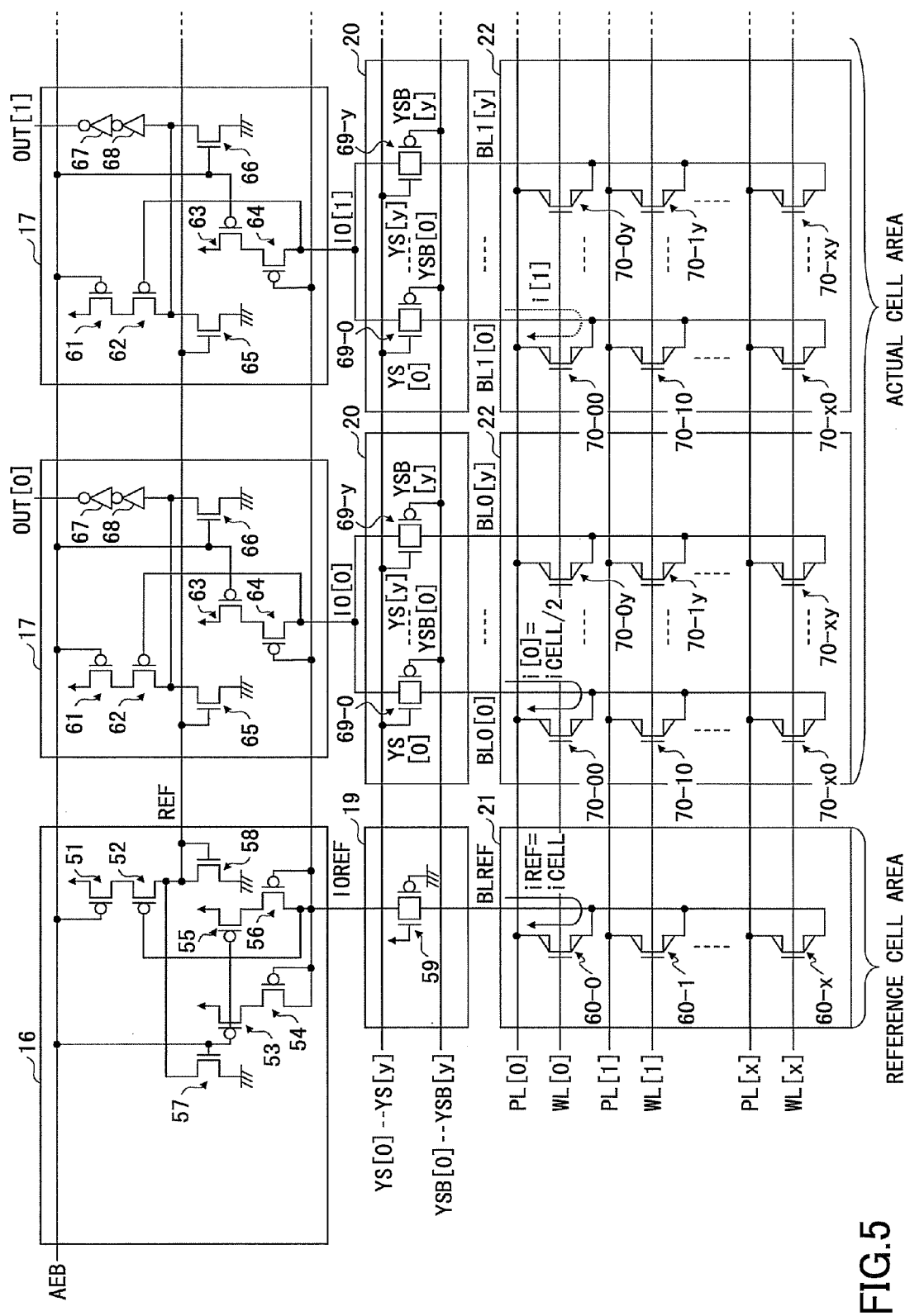
FIG. 5 is a drawing illustrating detailed configurations of part of the nonvolatile memory device illustrated in FIG. 1.

FIG. 5 is a drawing illustrating detailed configurations of part of the nonvolatile memory device 10 illustrated in FIG. 1. In FIG. 5, the same elements as those of FIG. 1 are referred to by the same numerals, and a description thereof may be omitted. FIG. 5 illustrates the reference amplifier 16, the sense amplifiers 17, the column switch 19, the column switches 20, the cell array 21, and the cell arrays 22. For the sake of illustration, the sense amplifiers 17, the column switches 20, and the cell arrays 22 are shown only for the $0^{th}$ bit (OUT[0]) and $1^{st}$ bit (OUT[1]) of the read data.

The reference amplifier 16 includes PMOS transistors 51 through 56 and NMOS transistors 57 and 58. The column switch 19 includes a transmission gate 59 comprised of an NMOS transistor and a PMOS transistor connected in parallel to each other. The gate of the NMOS transistor is coupled to VDD and the gate of the PMOS transistor is coupled to VSS, so that this transmission gate 59 is conductive all the time. The cell array 21 includes reference cell transistors 60-0 through 60-x. The reference cell transistors 60-0 through 60-x have the gates thereof connected to the respective word lines WL[0] through WL[x], the sources thereof connected to the respective plate lines PL[0] through PL[x], and the drains thereof connected to a reference bit line BLREF.

Each of the sense amplifiers 17 includes PMOS transistors 61 through 64, NMOS transistors 65 and 66, and inverters 67 and 68. Each of the column switches 20 includes transmission gates 69-0 through 69-y, each of which is comprised of an NMOS transistor and a PMOS transistor connected in parallel to each other. The gate of the NMOS transistor is coupled to a corresponding one of the column select signals YS[0] through YS[y]. The gate of the PMOS transistor is coupled to a corresponding one of the column select signals YSB[0] through YSB[y]. One of the transmission gates 69-0 through 69-y is made conductive in response to the column select signals YS[0] through YS[y] and YSB[0] through YSB[y]. Each of the cell arrays 22 includes memory cell transistors 70-00 through 70-xy arranged in x+1 rows and y+1 columns. The memory cell transistors 70-00 through 70-xy have the gates thereof connected to the corresponding word lines WL[0] through WL[x], the sources thereof connected to the corresponding plate lines PL[0] through PL[x], and the drains thereof connected to the corresponding bit lines BL0[0] through BL0[y] (for the $0^{th}$ bit).

In the reference amplifier 16 and the sense amplifiers 17, the transistors whose gates are coupled to the amplifier enable signal AEB are provided for the purpose of ensuring proper signal states when the amplifier enable signal AEB is set to HIGH to deactivate the amplifiers. The PMOS transistors 54 and 56 in the reference amplifier 16 are functionally equivalent to the PMOS transistors and 33 illustrated in FIG. 2. The PMOS transistor 64 in each of the sense amplifiers 17 is functionally equivalent to the PMOS transistor 34 illustrated in FIG. 2. The gates of the PMOS transistor 54, 56, and 64 are connected to each other. The PMOS transistor 64 thus serves to generate a current equal in amount to half the saturation current that flows through the one of the reference cell transistors 60-0 through 60-x selected by the word lines WL[0] through WL[x]. The amount of a reference current iREF is iCELL, which is the saturation current amount. A current i[0] generated by the PMOS transistor 64, which is equal in amount to iCELL/2, is supplied to one of the memory cell transistors 70-00 through 70-xy selected by the word lines WL[0] through WL[x] and column select signals YS[0] through YS[y] and YSB[0] through YSB[y].

The PMOS transistor 52 and NMOS transistor in the reference amplifier 16 and the PMOS transistor 62 and the NMOS transistor 65 in the sense amplifiers 17 together constitute an amplifier that is functionally equivalent to the amplifier 31 illustrated in FIG. 2. This amplifier amplifies a difference between the drain voltage of the PMOS transistor 56 and the drain voltage of the PMOS transistor 64 to produce a resultant signal voltage. This resultant signal voltage goes through the inverters 67 and 68 to be output as OUT[0] for the $0^{th}$ bit and OUT[1] for the $1^{st}$ bit In the example illustrated in FIG. 5, the memory cell transistor 70-00 is selected for data reading in each of the cell arrays 22. The memory cell transistor 70-00 for the $0^{th}$ bit may store "1". In such a case, the cell current i[0] is equal to iCELL/2, so that the read data OUT[0] is "1". The memory cell transistor 70-00 for the $1^{st}$ bit may store "0". In such a case, the cell current i[1] is very small, so that the read data OUT[1] is "0".

Figure 6:
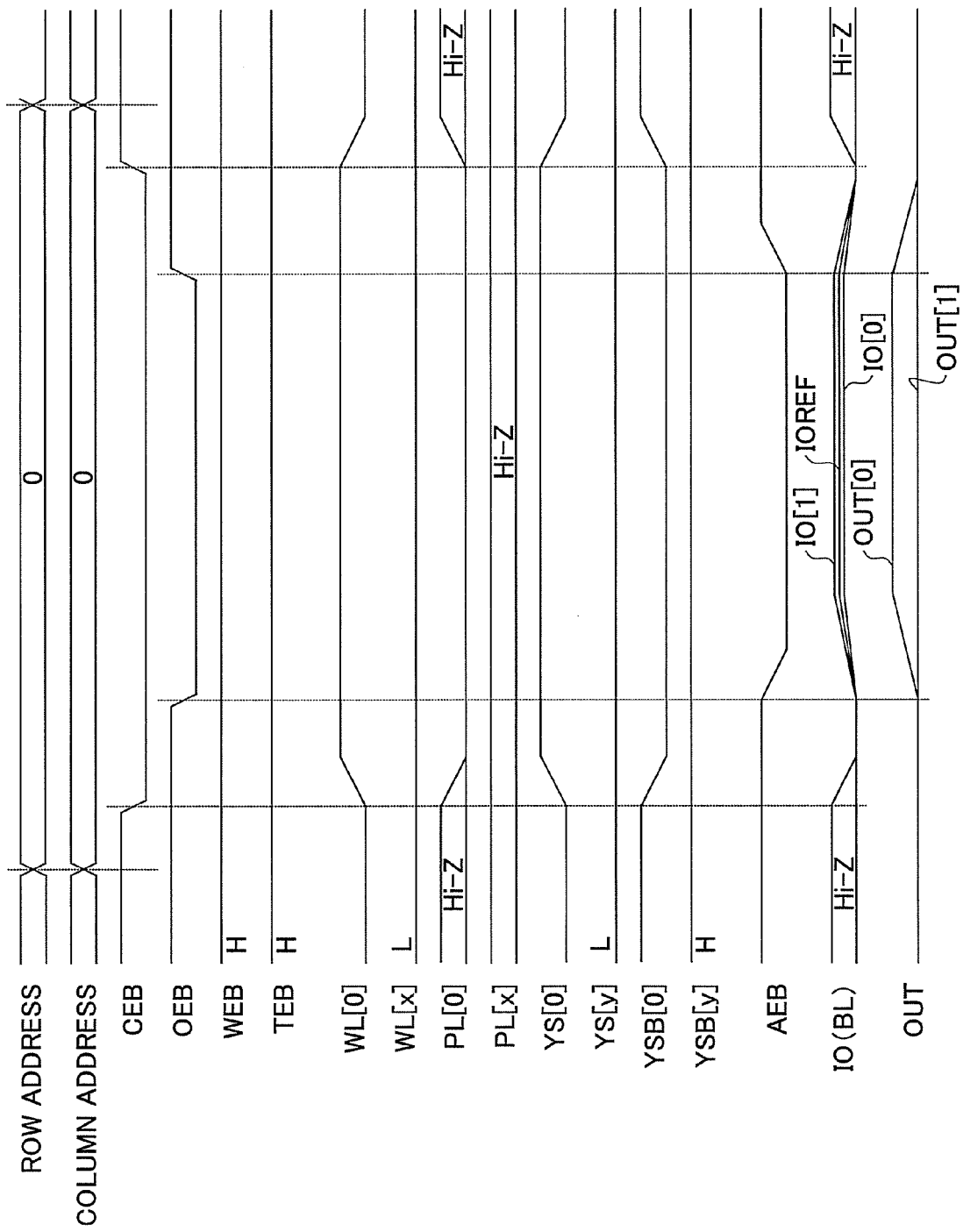
FIG. 6 is a timing chart illustrating an example of a read operation of the nonvolatile memory device.

FIG. 6 is a timing chart illustrating an example of a read operation of the nonvolatile memory device 10. In this example, the row address to be accessed is "0", and the column address to be accessed is "0". In response to a negative transition of the chip enable signal CEB, the word line WL[0] is changed to HIGH, and the plate line PL[0] is changed to LOW. Further, the column select signals YS[0] and YSB[0] are changed to HIGH and LOW, respectively, to select a corresponding bit line. In response to a negative transition of the output enable signal OEB, the amplifier enable signal AEB is changed to LOW for assertion, which causes the reference amplifier 16 and the sense amplifiers 17 illustrated in FIG. 5 to be activated. Upon activation of the amplifiers, cell currents start flowing through the selected cell transistors, so that voltages IOREF, IO[0], and IO[1] at the input nodes of the amplifiers begin to appear. The voltage IOREF at the input node of the reference amplifier 16 has a middle voltage. In this example, the voltage IO[0] at the input node of the $0^{th}$-bit sense amplifier 17 has a low voltage, and the voltage IO[1] at the input node of the $1^{st}$-bit sense amplifier 17 has a high voltage. As a result, the read data OUT[0] is "1", and the read data OUT[1] is "0".

Figure 7:
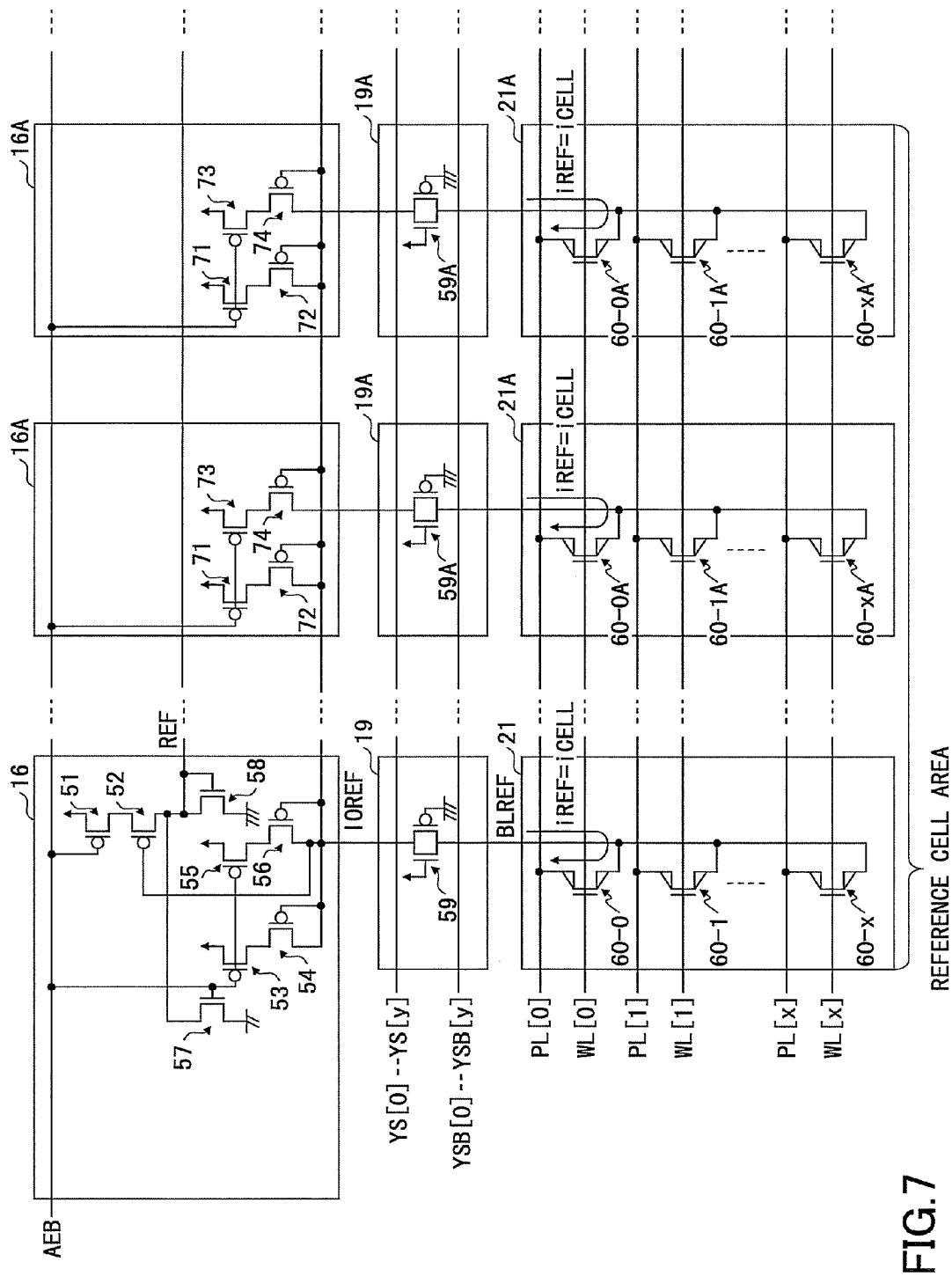
FIG. 7 is a drawing illustrating a variation of a reference amplifier, a column switch, and a cell array.

FIG. 7 is a drawing illustrating a variation of the reference amplifier, column switch, and cell array. In FIG. 7, the same elements as those of FIG. 5 are referred to by the same numerals, and a description thereof may be omitted. In FIG. 7, additional reference amplifiers 16A are provided in addition to the reference amplifier 16. Additional column switches 19A and additional cell arrays 21A are also provided. Each of the additional reference amplifiers 16A includes PMOS transistors 71 through 74, which are substantially the same as the PMOS transistors 53 through 56 situated in the reference amplifier 16. That is, the PMOS transistors 71 through 74 have the same characteristics as the PMOS transistors 53 through 56. Each of the additional column switches 19A includes a transmission gate 59A, which is substantially the same as the transmission gate 59. Each of the cell arrays 21A includes reference cell transistors 60-0A through 60-xA, which are substantially the same as the reference cell transistors 60-0 through 60-x.

The provision of additional reference amplifiers, additional column switches, and cell arrays makes it possible to stabilize the voltage IOREF at the input node of the reference amplifier 16 despite variation in transistor characteristics. Accordingly, the configuration illustrated in FIG. 7 serves to produce a stable reference current and a stable reference voltage REF, thereby improving the accuracy of data sensing.

Figure 8:
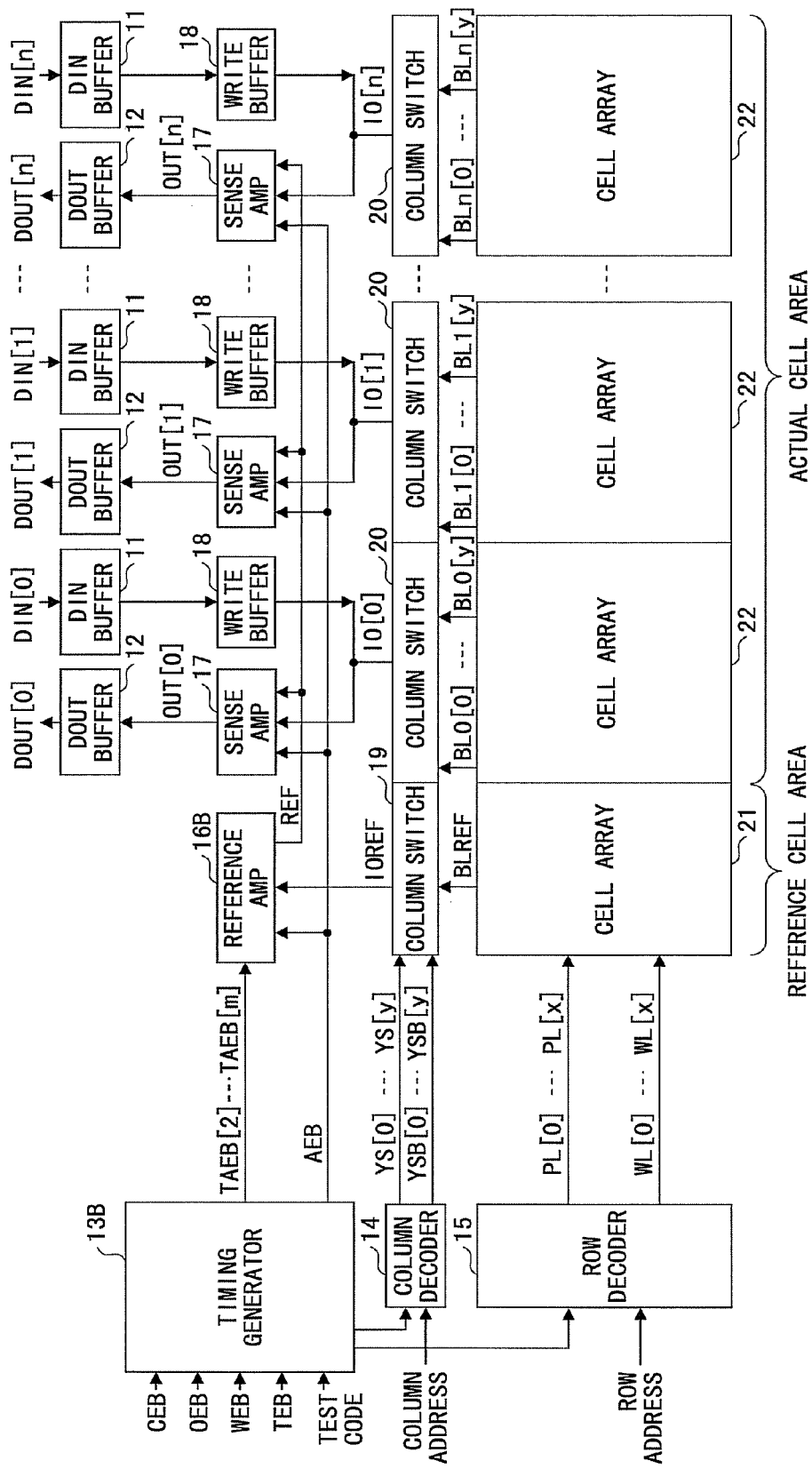
FIG. 8 is a block diagram showing a variation of the nonvolatile semiconductor memory device according to the first embodiment.

FIG. 8 is a block diagram showing a variation of the nonvolatile semiconductor memory device according to the first embodiment. In FIG. 8, the same elements as those of FIG. 1 are referred to by the same numerals, and a description thereof may be omitted. In FIG. 8, a timing generator 13B and a reference amplifier 16B are provided in place of the timing generator 13 and the reference amplifier 16 illustrated in FIG. 1. In this configuration, the timing generator 13B receives a test code comprised of a plurality of bits. The timing generator 13B decodes the received test code to supply test amplifier enable signals TAEB[2] through TAEB[m] responsive to the decode result to the reference amplifier 16B. The number of the test amplifier enable signals TAEB[2] through TAEB[m] that are asserted at LOW depends on the test code provided from an external source.

Figure 9:
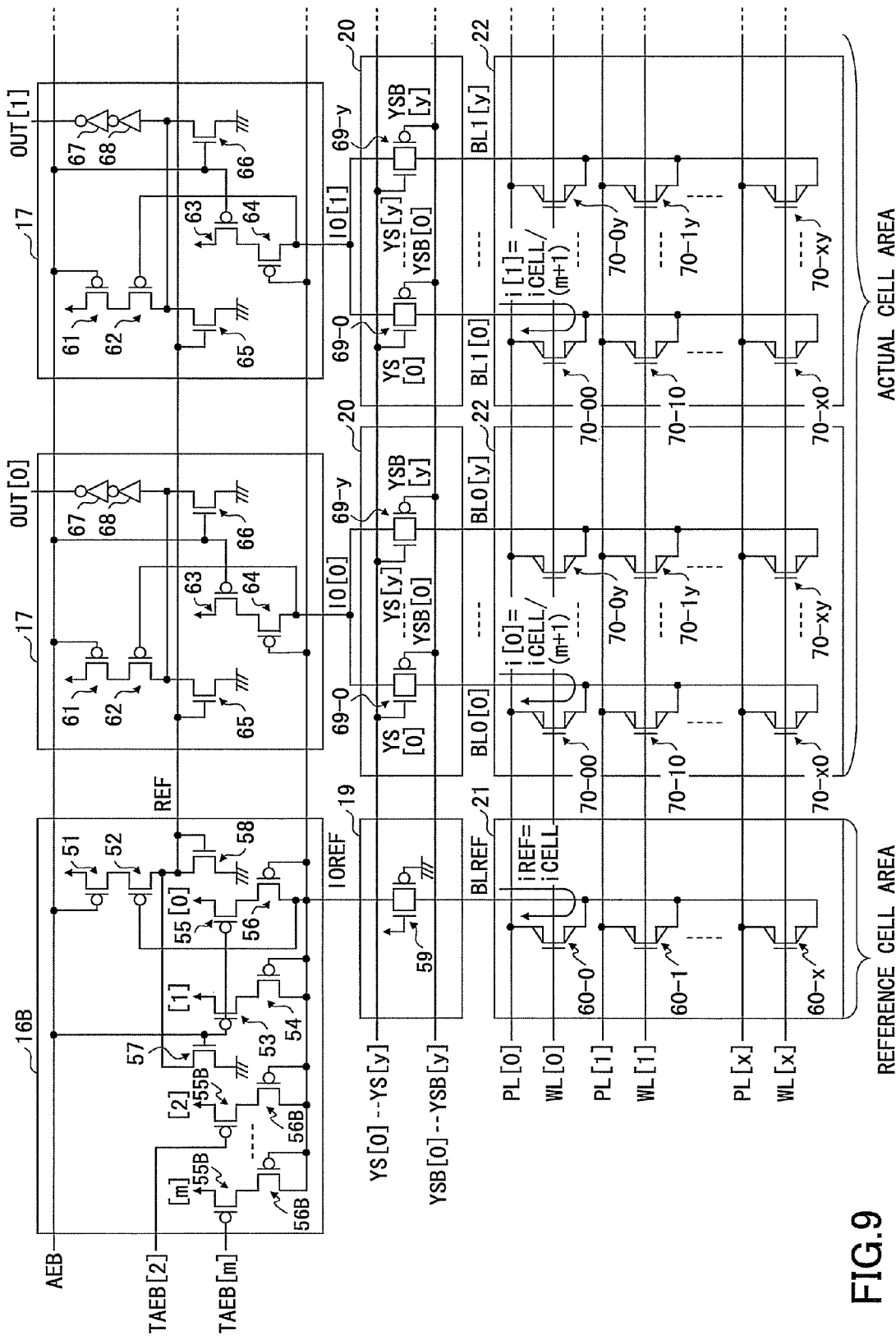
FIG. 9 is a drawing illustrating the configuration of a reference amplifier used in the variation of the first embodiment.

FIG. 9 is a drawing illustrating the configuration of the reference amplifier 16B used in the variation of the first embodiment. In FIG. 9, the same elements as those of FIG. 5 are referred to by the same numerals, and a description thereof may be omitted. The reference amplifier 16B illustrated in FIG. 9 differs from the reference amplifier 16 illustrated in FIG. 5 in that additional PMOS transistors 55B and additional PMOS transistors 56B are provided. Each of the PMOS transistors 55B has the same characteristics as the PMOS transistor 55, and each of the PMOS transistors 56B has the same characteristics as the PMOS transistor 56. The gates of the PMOS transistors 55B receive the test amplifier enable signals TAEB[2] through TAEB[m], respectively. The gates and drains of the PMOS transistors 56B are coupled to the gate and drain of the PMOS transistor 56.

A given one of the PMOS transistors 55B and a corresponding one of the PMOS transistors 56B serve to produce the same amount of current as a pair of the PMOS transistors 55 and 56. The test code applied to the timing generator 13B (see FIG. 8) determines how many test amplifier enable signals are asserted at LOW. For example, the test code may indicate "1", so that the test amplifier enable signal TAEB[2] is LOW while the remaining test amplifier enable signals TAEB[3] through TAEB[m] are HIGH. In this case, a cell current equal in amount to one-third the saturation current of the reference cell is produced by each of the sense amplifiers 17. Further, the test code may indicate "2", so that the test amplifier enable signals TAEB[2] and TAEB[3] are LOW while the remaining test amplifier enable signals TAEB[4] through TAEB[m] are HIGH. In this case, a cell current equal in amount to one-fourth the saturation current of the reference cell is produced by each of the sense amplifiers 17. When all the test amplifier enable signals TAEB[2] through TAEB[m] are asserted at LOW, a cell current equal in amount to iCELL/(m+1) as illustrated in FIG. 9 is produced by each of the sense amplifiers 17.

A memory cell transistor that stores "1" is sensed as data "1" regardless of the value indicated by the test code. However, a memory cell transistor that stores "0" may be sensed as data "1" if the value indicated by the test code is sufficiently large. After writing "0" to a given memory address, the written data may be read repeatedly while specifying different test code values. The test code value may be decreased from the maximum value to the minimum value. In such a case, read data may be "1" for the first one or more read operations, and may turn into "0" for the remaining read operations. The test code value used when such a change occurs in the read data signifies the depth or strength of data writing (i.e., the amount of trapped electrons). Such successive read operations can thus be conducted to test and check the depth or strength of data writing in memory cell transistors.

Figure 10:
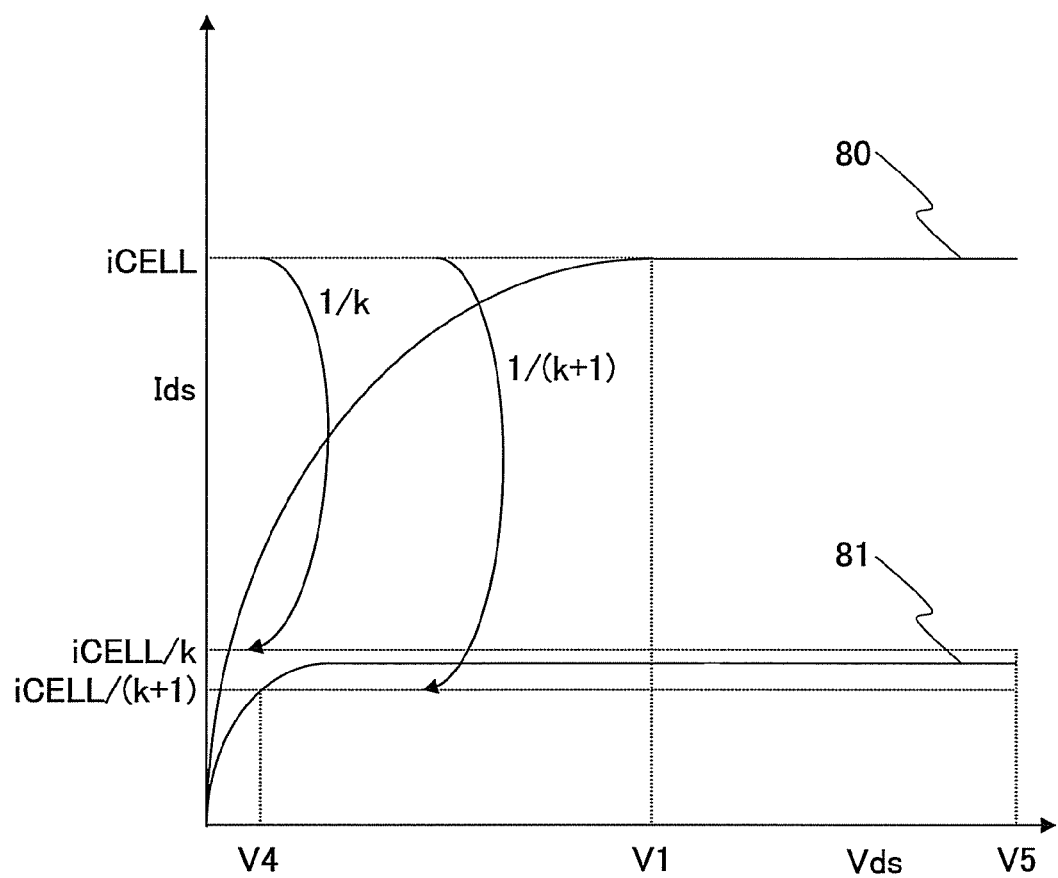
FIG. 10 is a drawing illustrating a change in read data in response to a change in a test code value.

FIG. 10 is a drawing illustrating a change in read data in response to a change in the test code value. The horizontal axis represents a drain-source voltage Vds, which is a voltage between the gate and source of a cell transistor. The vertical axis represents a drain-source current Ids, which is a current flowing through the channel between the drain and source of a cell transistor. A characteristic curve 80 represents the relationship between Vds and Ids of a memory cell transistor in the initial state before "0" is written. This characteristic curve 40 also represents the relationship between Vds and Ids of a reference cell transistor. A characteristic curve 81 represents the relationship between Vds and Ids of the memory cell transistor after "0" is written. The amount of a saturation current flowing through the reference cell transistor is iCELL. When the test code value is k+1, a cell current equal in amount to iCELL/(k+1) is supplied to the memory cell transistor that stores "0". In this case, the voltage at the drain of the memory cell transistor becomes V4, resulting in the sensed data being "1". When the test code value is k, a cell current equal in amount to iCELL/k tries to flow through the memory cell transistor that stores "0". In this case, the voltage at the drain of the memory cell transistor becomes V5, resulting in the sensed data being "0".

Figure 11:
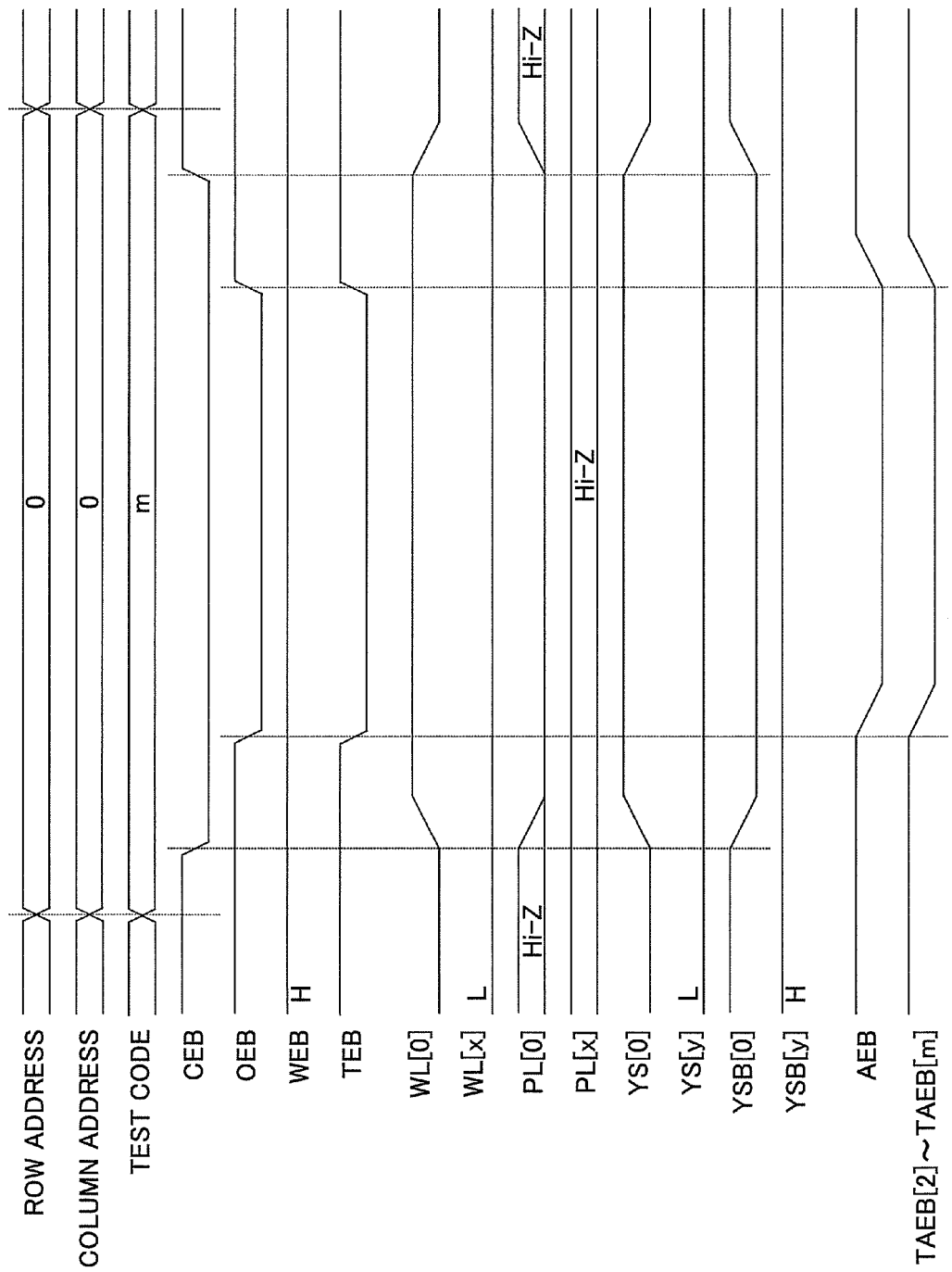
FIG. 11 is a timing chart illustrating an example of a read operation of the nonvolatile memory device illustrated in FIG. 8.

FIG. 11 is a timing chart illustrating an example of a read operation of the nonvolatile memory device illustrated in FIG. 8. In this example, the row address to be accessed is "0", and the column address to be accessed is "0". Further, the specified test code is m in this case. In response to a negative transition of the chip enable signal CEB, the word line WL[0] is changed to HIGH, and the plate line PL[0] is changed to LOW. Further, the column select signals YS[0] and YSB[0] are changed to HIGH and LOW, respectively, to select a corresponding bit line. In response to a negative transition of the output enable signal OEB, the amplifier enable signal AEB is changed to LOW for assertion, which causes the reference amplifier 16B and the sense amplifiers 17 illustrated in FIG. 9 to be activated. At the same time as the assertion of the amplifier enable signal AEB, all the test amplifier enable signals TAEB[2] through TAEB[m] are asserted at LOW. In this case, thus, a cell current flowing through a memory cell transistor that stores "1" is equal in amount to the saturation current divided by m. The read data is then checked to determine whether the read data is the same as previously stored data for a memory cell transistor that stores "0".

Figure 12:
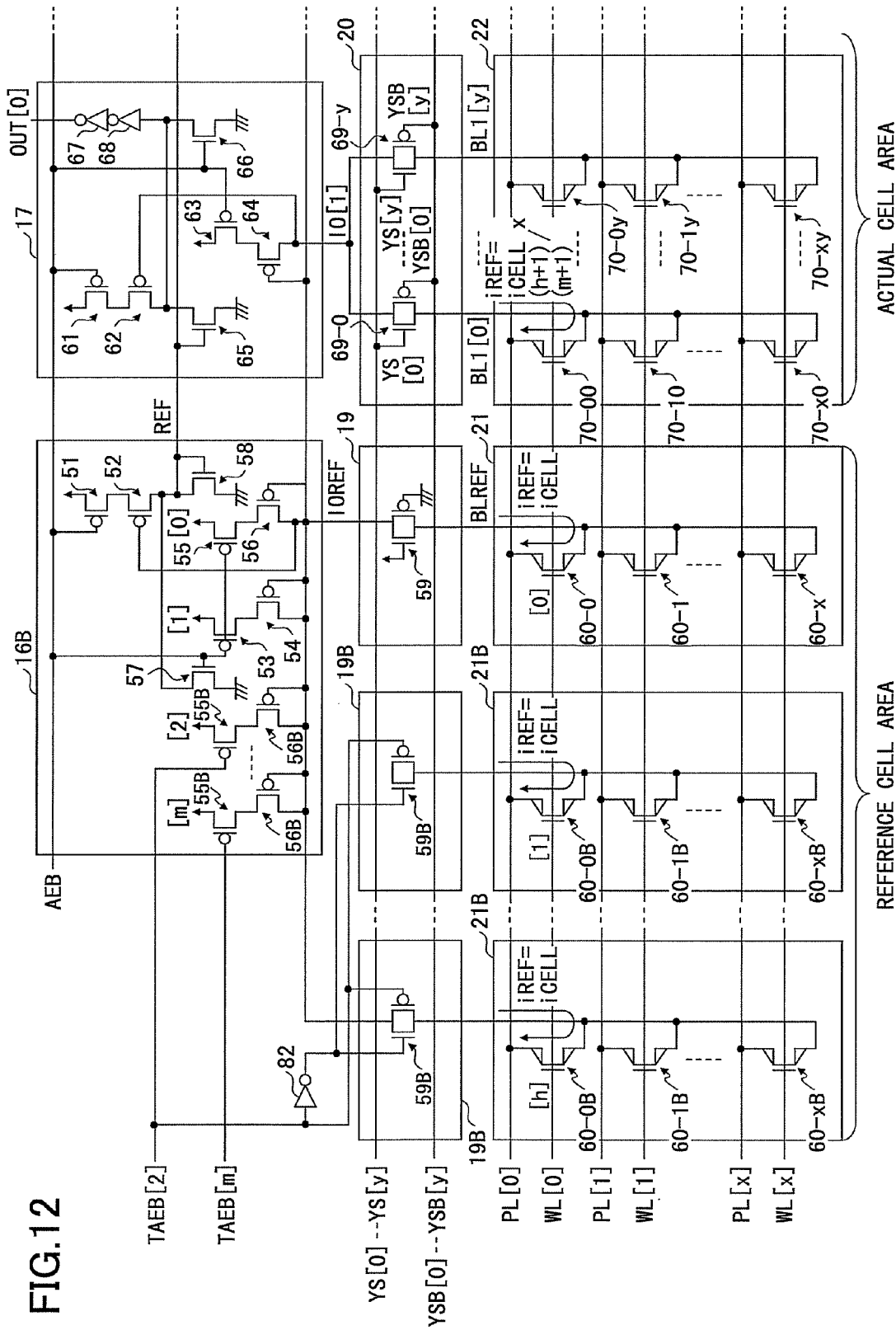
FIG. 12 is a drawing illustrating a variation of the configuration illustrated in FIG. 9.

FIG. 12 is a drawing illustrating a variation of the configuration illustrated in FIG. 9. In FIG. 12, the same elements as those of FIG. 9 are referred to by the same numerals, and a description thereof may be omitted. In FIG. 12, additional reference amplifiers 16B are provided in addition to the reference amplifier 16. Additional column switches 19B and additional cell arrays 21B are also provided. Each of the additional column switches 19B includes a transmission gate 59B, which is substantially the same as the transmission gate 59. Each of the cell arrays 21B includes reference cell transistors 60-0B through 60-xB, which are substantially the same as the reference cell transistors 60-0 through 60-x. The test amplifier enable signal TAEB[2] is supplied to the gate of the PMOS transistor of each transmission gate 59B. The test amplifier enable signal TAEB[2] is also inverted by an inverter 82 for provision to the gate of the NMOS transistor of each transmission gate 59B. Accordingly, the additional cell arrays 21B are connected to the reference amplifier 16B only when the test amplifier enable signal TAEB[2] is set to LOW for assertion. Here, the number of the cell arrays 21B is h.

The provision of additional column switches and cell arrays makes it possible to produce a cell current that is larger than half the saturation current. The configuration illustrated in FIG. 9 can only produce a cell current whose amount is ½, ⅓, ¼, . . . , or 1/(m+1). The configuration illustrated in FIG. 12, on the other hand, can produce a cell current whose amount is (h+1)/2, (h+1)/3, (h+1)/4, . . . , or (h+1)/(m+1). Further, the configuration illustrated in FIG. 12 may produce a cell current whose amount is ½, ⅓, ¼, . . . , or 1/m by refraining from asserting the test amplifier enable signal TAEB[2].

Figure 13:
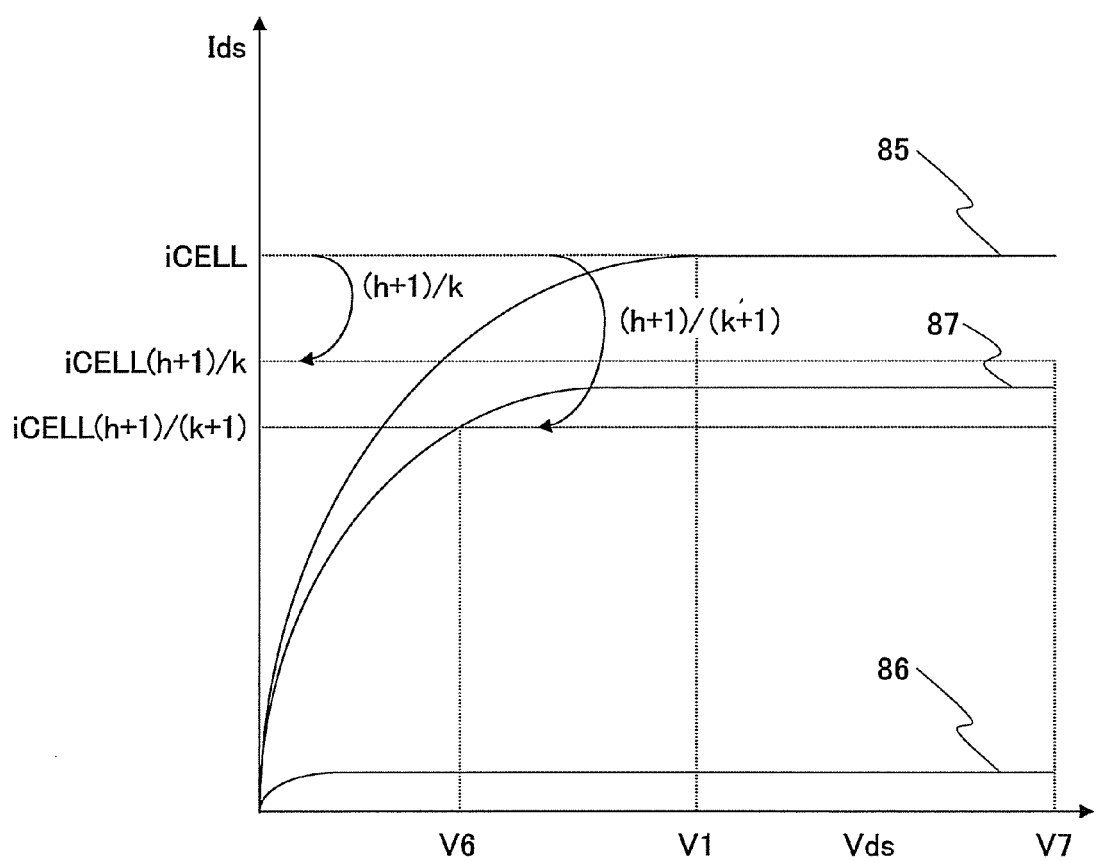
FIG. 13 is a drawing illustrating a change in read data in response to a change in the test code value.

FIG. 13 is a drawing illustrating a change in read data in response to a change in the test code value. The horizontal axis represents a drain-source voltage Vds, which is a voltage between the drain and source of a cell transistor. The vertical axis represents a drain-source current Ids, which is a current flowing through the channel between the drain and source of a cell transistor. A characteristic curve 85 represents the relationship between Vds and Ids of a memory cell transistor in the initial state before "0" is written. This characteristic curve 85 also represents the relationship between Vds and Ids of a reference cell transistor. Characteristic curves 86 and 87 represent the relationship between Vds and Ids of the memory cell transistor after "0" is written. The depth or strength of data writing is greater for the characteristic curve 86. The characteristic curve 87 may represent a case in which a data write operation has been insufficient. The amount of a saturation current flowing through the reference cell transistor is iCELL. When the test code value is k+1, a cell current equal in amount to iCELL(h+1)/(k+1) is supplied to the memory cell transistor that stores "0" as illustrated by the characteristic curve 87. In this case, the voltage at the drain of the memory cell transistor becomes V6, resulting in the sensed data being "1". When the test code value is k, a cell current equal in amount to iCELL(h+1)/k tries to flow through the memory cell transistor that stores "0" as illustrated by the characteristic curve 87. In this case, the voltage at the drain of the memory cell transistor becomes V7, resulting in the sensed data being "0". It should be noted that h+1 must be smaller than k to produce a cell current that is smaller than the saturation current iCELL.

FIGS. 14A through 14D are drawings illustrating the trapping of electrons in sidewalls. FIG. 15 is a drawing illustrating voltage-current characteristics of a memory cell transistor when electrons are trapped in sidewalls. A memory cell transistor illustrated in FIGS. 14A through 14D includes a gate 90 coupled to a word line WL, sidewalls 91 and 92, a drain region 93 coupled to a bit line BL, and a source region 94 coupled to a plate line PL. As previously described, the PermSRAM employs a MIS transistor as a memory cell transistor by taking advantage of the hot carrier effect. The bit line BL may be set to LOW (i.e., VSS=0 V), and the plate line PL may be set to extra HIGH (e.g., 5.0 V) while the word line WL may be set to HIGH (i.e., VDD=1.8 V, for example). With this voltage conditions, the hot carrier effect occurs to cause electrons to be trapped mainly in the sidewall 92. Conversely, the bit line BL may be set to the extra HIGH, and the plate line PL may be set to LOW while the word line WL may be set to HIGH. With these voltage conditions, the hot carrier effect occurs to cause electrons to be trapped mainly in the sidewall 91. If both of these voltage conditions are used one after another, electrons will be trapped in the sidewalls 91 and 92.

Figure 14A:
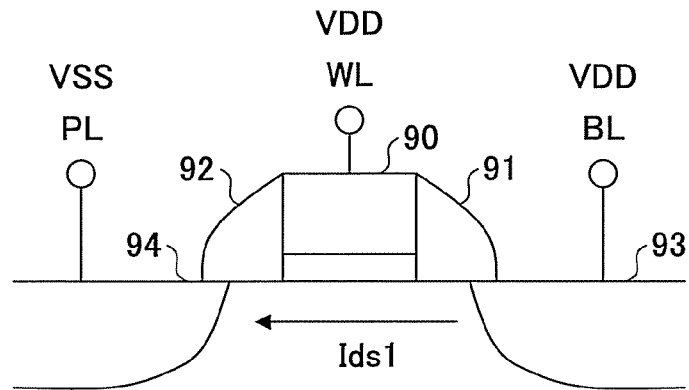
FIGS. 14A through 14D are drawings illustrating the trapping of electrons in sidewalls.
Figure 14B:
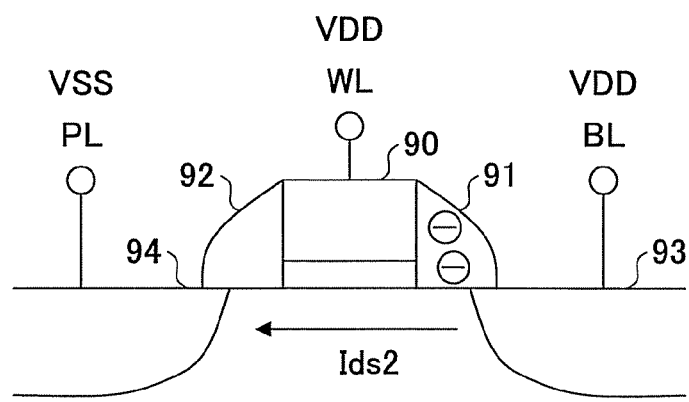
Figure 14C:
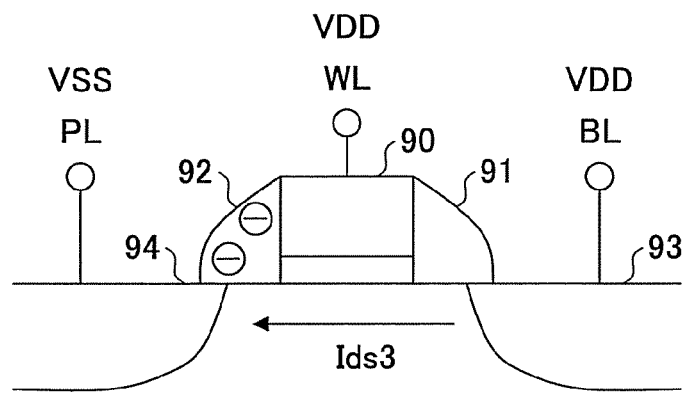
Figure 14D:
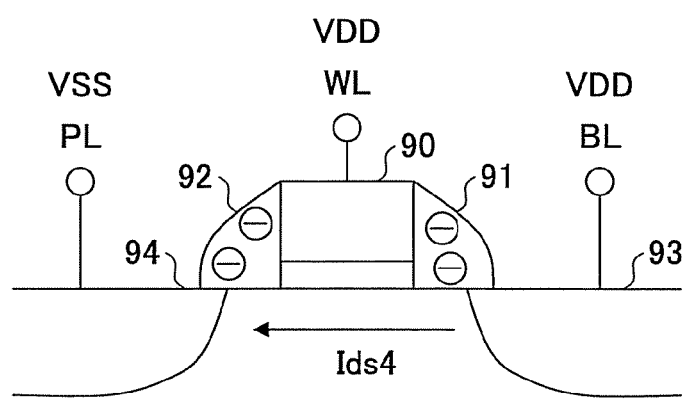
Figure 15:
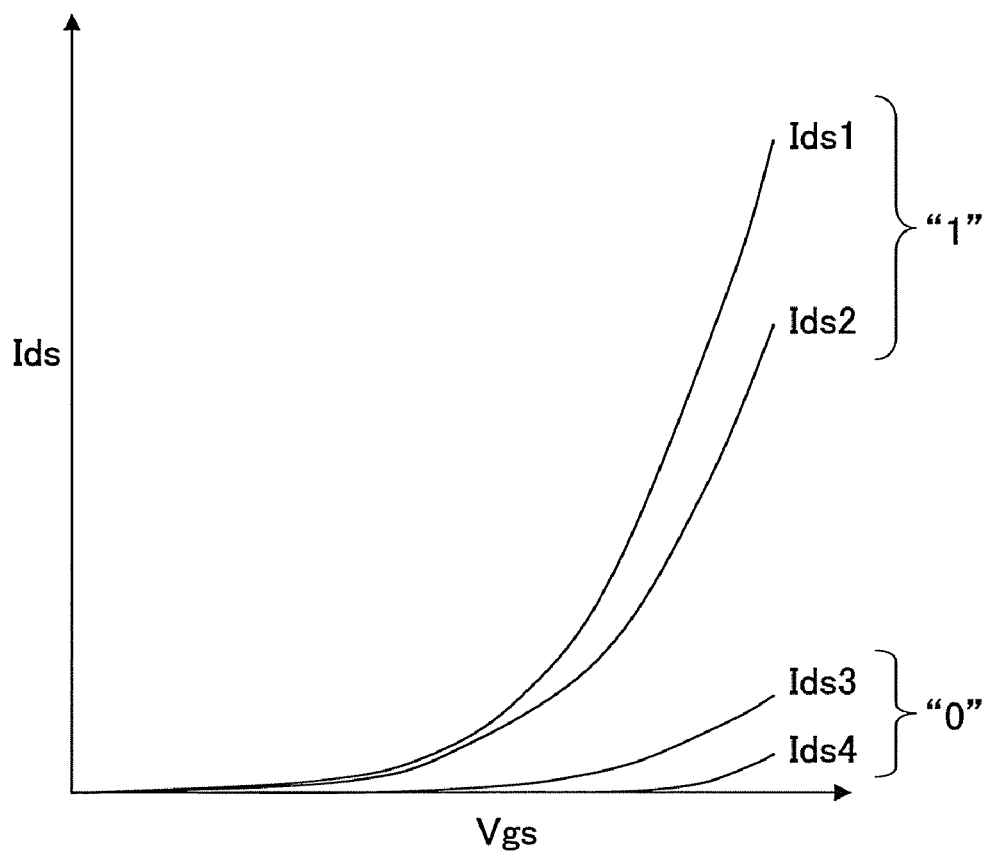
FIG. 15 is a drawing illustrating voltage-current characteristics of a memory cell transistor when electrons are trapped in sidewalls.

During a data read operation, the memory cell transistor of the PermSRAM may be placed under the voltage conditions as illustrated in FIGS. 14A through 14D. Namely, the bit line BL is set to HIGH (i.e., VDD), and the plate line PL is set to LOW (i.e., VSS) while the word line WL is set to HIGH (i.e., VDD). With such voltage conditions, a drain-source current flows from the drain region 93 to the source region 94. FIG. 14A illustrates a case in which no electron is trapped in the sidewalls 91 and 92. In this case, the threshold voltage is the smallest, and a drain-source current Ids1 is the largest as illustrated in FIG. 15. FIG. 14B illustrates a case in which electrons are trapped in the sidewall 91. In this case, the threshold voltage is the second smallest, and a drain-source current Ids2 is the second largest as illustrated in FIG. 15. FIG. 14C illustrates a case in which electrons are trapped in the sidewall 92. In this case, the threshold voltage is the second largest, and a drain-source current Ids3 is the second smallest as illustrated in FIG. 15. FIG. 14D illustrates a case in which electrons are trapped in the sidewalls 91 and 92. In this case, the threshold voltage is the largest, and a drain-source current Ids4 is the smallest as illustrated in FIG. 15.

In the nonvolatile memory device 10 of the first embodiment, the data write and read condition as illustrated in FIG. 14C may be used. Namely, the bit line BL is set to LOW, and the plate line PL is set to extra HIGH while the word line WL is set to HIGH, thereby causing electrons to be trapped mainly in the sidewall 92. The data read operation is then performed by causing a drain-source current to flow from the bit line BL to the plate line PL. In such a case, the Vgs-Ids characteristic curve corresponding to Ids3 in FIG. 15 is used.

As will be described below, the trapping of electrons in a selected one of the sidewalls makes it possible to store 2 bits in a single memory cell transistor. As can be understood from FIG. 15, the Vgs-Ids characteristic curves corresponding to Ids1 and Ids2 may be treated as a data-storage condition storing and the Vgs-Ids characteristic curves corresponding to Ids3 and Ids4 may be treated as a data-storage condition storing "0". With such arrangement, the electron trap conditions as illustrated in FIGS. 14A and 14B may correspond to the storing of "1", and the electron trap conditions as illustrated in FIGS. 14C and 14D may correspond to the storing of "0". It should be noted here that if the direction of a drain-source current is reversed during a data read operation, the electron trap conditions as illustrated in FIGS. 14A and 14C may correspond to the storing of "1", and the electron trap conditions as illustrated in FIGS. 14B and 14D may correspond to the storing of "0".

Figure 16A:
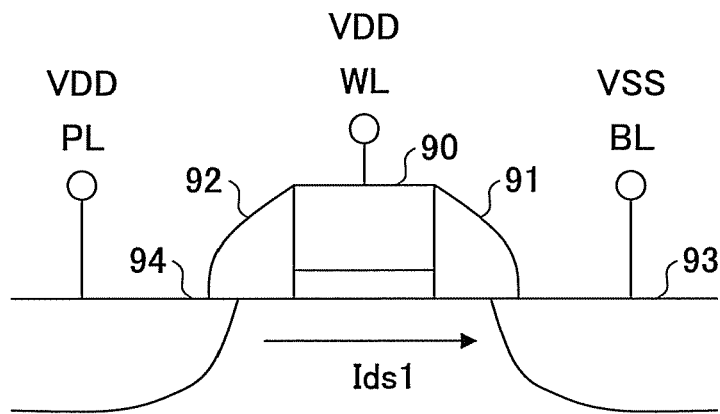
FIGS. 16A through 16D are drawings illustrating four different electron trap conditions for which a data read operation is performed by using a drain-source current flowing in the reversed direction.
Figure 16B:
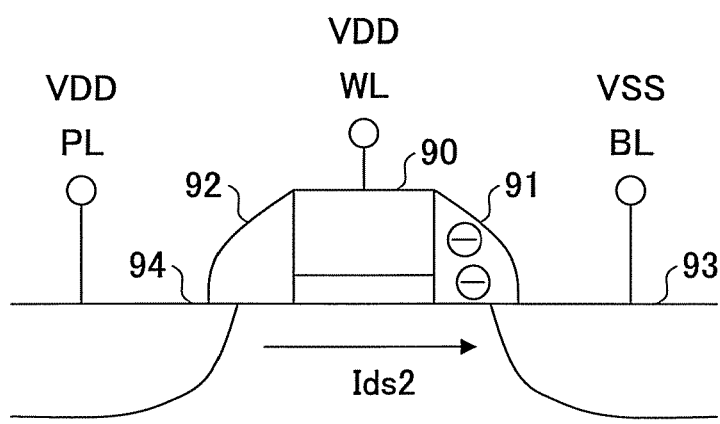
Figure 16C:
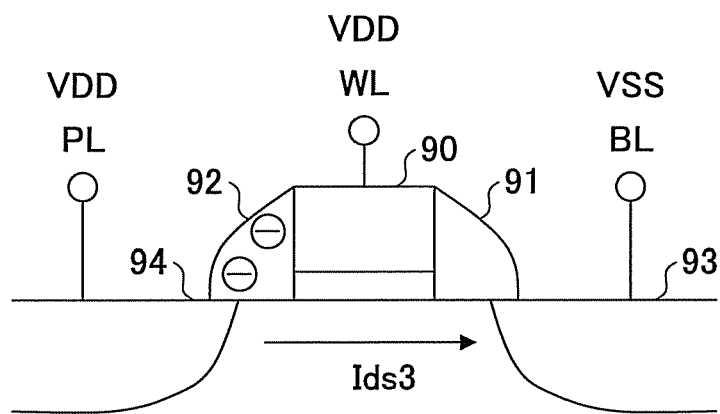
Figure 16D:
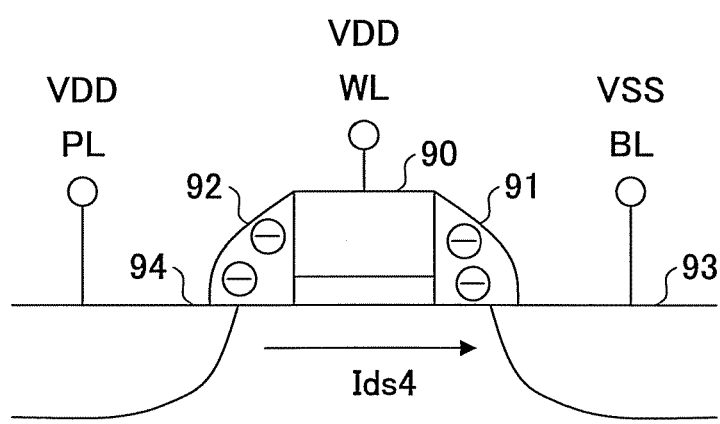
Figure 17:
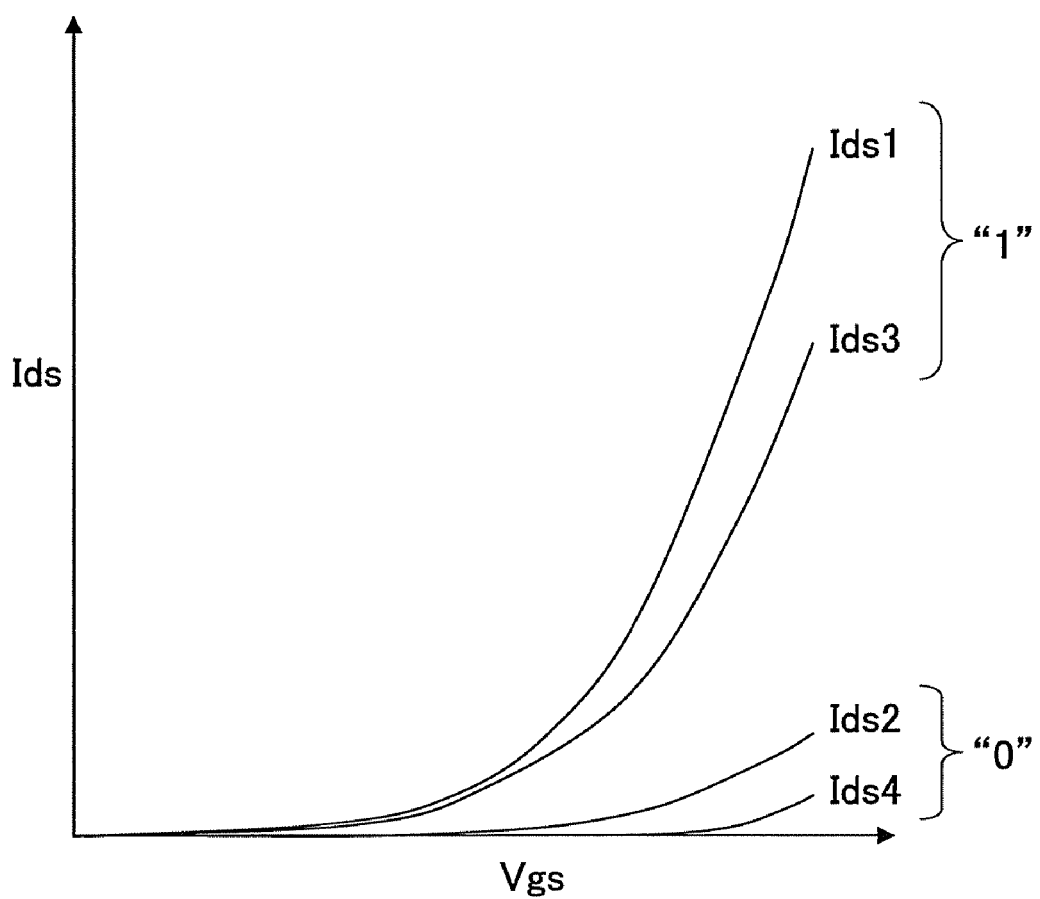
FIG. 17 is a drawing illustrating voltage-current characteristics of a memory cell transistor when a reversed direction current is used.

FIGS. 16A through 16D are drawings illustrating four different electron trap conditions for which a data read operation is performed by using a drain-source current flowing in the reversed direction. FIG. 17 is a drawing illustrating voltage-current characteristics of a memory cell transistor when a reversed direction current is used. As can be seen, the four types of electron trap conditions illustrated in FIGS. 16A through 16D are the same as the four types of electron trap conditions illustrated in FIGS. 14A through 14D. In the case of FIGS. 16A through 16D, however, the direction of a drain-source current is reversed from the direction of a drain-source current used in FIGS. 14A through 14D. In this case, the electron trap conditions as illustrated in FIGS. 16A and 16C (i.e., Ids1 and Ids3) may correspond to the storing of "1", and the electron trap conditions as illustrated in FIGS. 16B and 16D (i.e., Ids2 and Ids4) may correspond to the storing of "0". The Vgs-Ids characteristic curves corresponding to Ids1 through Ids4 are illustrated in FIG. 17. As is illustrated in FIG. 17, the Vgs-Ids characteristic curves corresponding to Ids1 and Ids3 may be treated as a data-storage condition storing "1", and the Vgs-Ids characteristic curves corresponding to Ids2 and Ids4 may be treated as a data-storage condition storing "0".

Accordingly, provision may be made such that a selected one of the sidewalls is caused to trap electrons during a data write operation, and such that one of the two directions of a drain-source current is selected during a data read operation. Such provision makes it possible to store 2 bits in a single memory cell transistor of the PermSRAM.

Figure 18:
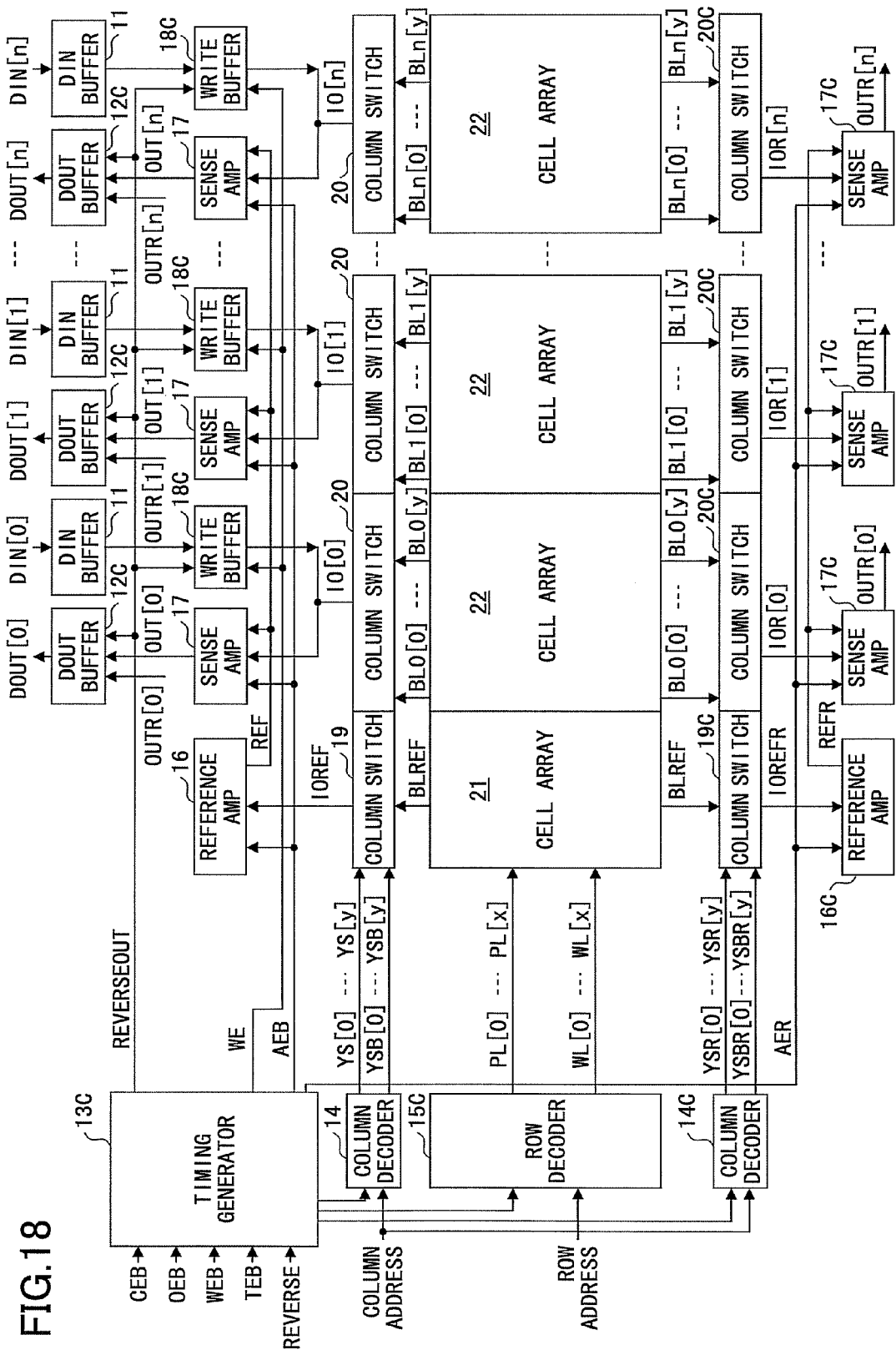
FIG. 18 is a block diagram showing the configuration of a nonvolatile semiconductor memory device according to a second embodiment.

FIG. 18 is a block diagram showing the configuration of a nonvolatile semiconductor memory device according to a second embodiment. In FIG. 18, the same elements as those of FIG. 1 are referred to by the same numerals, and a description thereof may be omitted. A nonvolatile memory device shown in FIG. 18 includes DIN buffers 11, DOUT buffers 12C, a timing generator 13C, a column decoder 14, a column decoder 14C, a row decoder 15C, a reference amplifier 16, a reference amplifier 16C, sense amplifiers 17, sense amplifiers 17C, write buffers 18C, a column switch 19, a column switch 19C, column switches 20, column switches 20C, a cell array 21, and cell arrays 22. The reference amplifier 16, the sense amplifiers 17, the column switch 19, and the column switches 20 are used to read data by employing a cell current that flows from the sense amplifiers 17 to one of the plate lines PL[0] through PL[x]. The reference amplifier 16C, the sense amplifiers 17C, the column switch 19C, and the column switches 20C are used to read data by employing a reversed cell current that flows from one of the plate lines PL[0] through PL[x] to the sense amplifiers 17C.

The timing generator 13C generates various timing signals and control signals for provision to various parts of the nonvolatile memory device to control the operation of the nonvolatile memory device. A reverse bit enable signal REVERSE is asserted to the timing generator 13C from an external source in order to perform a data read operation that utilizes a reversed drain-source current. The timing generator 13C supplies a reverse output enable signal REVERSEOUT to the DOUT buffers 12C and the write buffers 18C, and also supplies a write enable signal WE to the write buffers 18C. Further, the timing generator 13C supplies an amplifier enable signal AER to the reference amplifier 16C and the sense amplifiers 17C. The amplifier enable signal AER is asserted at HIGH.

The column decoder 14C produces column select signals YSR[0] through YSR[y] and YSBR[0] through YSBR[y]. The column select signals YSR[0] through YSR[y] and the column select signals YSBR[0] through YSBR[y] are complementary to each other. The column decoder 14C decodes the column address signals to activate one of the column select signals YSR[0] through YSR[y] and one of the column select signals YSBR[0] through YSBR[y] to specify a column to be accessed.

Figure 19:
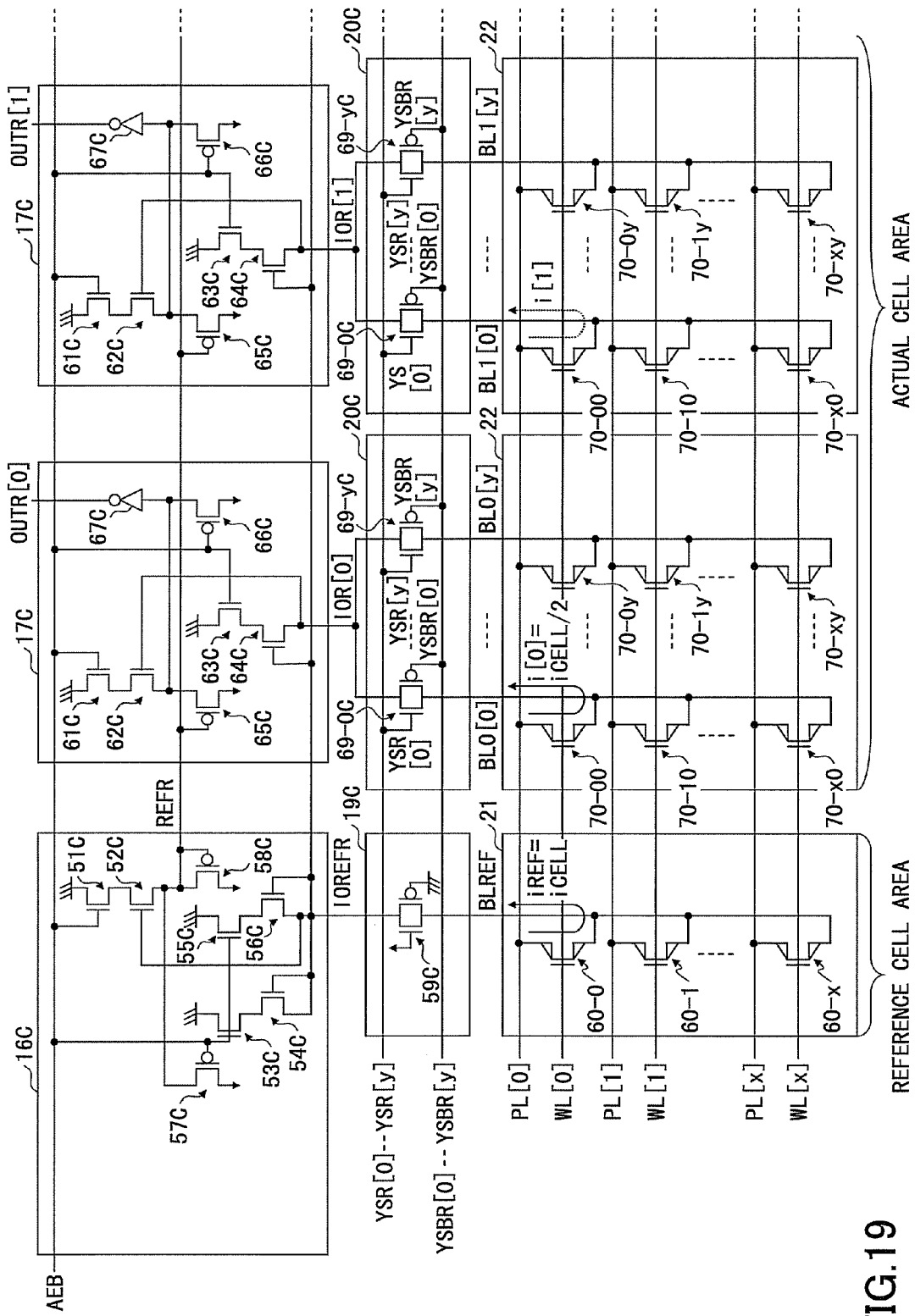
FIG. 19 is a drawing illustrating detailed configurations of part of the nonvolatile memory device illustrated in FIG. 18.

FIG. 19 is a drawing illustrating detailed configurations of part of the nonvolatile memory device illustrated in FIG. 18. In FIG. 19, the same elements as those of FIG. 18 are referred to by the same numerals, and a description thereof may be omitted. FIG. 19 illustrates the reference amplifier 16C, the sense amplifiers 17C, the column switch 19C, the column switches 20C, the cell array 21, and the cell arrays 22. For the sake of illustration, the sense amplifiers 17C, the column switches 20C, and the cell arrays 22 are shown only for the $0^{th}$ bit (OUTR[0]) and $1^{st}$ bit (OUTR[1]) of the read data.

The reference amplifier 16C includes NMOS transistors 51C through 56C and PMOS transistors 57C and 58C. The column switch 19C includes a transmission gate 59C comprised of an NMOS transistor and a PMOS transistor connected in parallel to each other. The gate of the NMOS transistor is coupled to VDD and the gate of the PMOS transistor is coupled to VSS, so that this transmission gate 59C is conductive all the time.

Each of the sense amplifiers 17C includes NMOS transistors 61C through 64C, PMOS transistors 65C and 66C, and an inverter 67C. Each of the column switches 20C includes transmission gates 69-00 through 69-yC, each of which is comprised of an NMOS transistor and a PMOS transistor connected in parallel to each other. The gate of the NMOS transistor is coupled to a corresponding one of the column select signals YSR[0] through YSR[y]. The gate of the PMOS transistor is coupled to a corresponding one of the column select signals YSBR[0] through YSBR[y]. One of the transmission gates 69-00 through 69-yC is made conductive in response to the column select signals YSR[0] through YSR[y] and YSBR[0] through YSBR[y].

In the reference amplifier 16C and the sense amplifiers 17C, the transistors whose gates are coupled to the amplifier enable signal AER are provided for the purpose of ensuring proper signal states when the amplifier enable signal AER is set to LOW to deactivate the amplifiers. The NMOS transistors 54C and 56C in the reference amplifier 16C are functionally equivalent to the PMOS transistors 32 and 33 illustrated in FIG. 2. The NMOS transistor 64C in each of the sense amplifiers 17C is functionally equivalent to the PMOS transistor 34 illustrated in FIG. 2. The gates of the NMOS transistor 54C, 56C, and 64C are connected to each other. The NMOS transistor 64C thus serves to generate a current equal in amount to half the saturation current that flows through the one of the reference cell transistors 60-0 through 60-x selected by the word lines WL[0] through WL[x]. The amount of a reference current iREF is iCELL, which is the saturation current amount. A current i[0] generated by the NMOS transistor 64C, which is equal in amount to iCELL/2, is supplied to one of the memory cell transistors 70-00 through 70-xy selected by the word lines WL[0] through WL[x] and column select signals YS[0] through YS[y] and YSB[0] through YSB[y].

The NMOS transistor 52C and PMOS transistor 58C in the reference amplifier 16C and the NMOS transistor 62C and the PMOS transistor 65C in the sense amplifiers 17C together constitute an amplifier that is functionally equivalent to the amplifier 31 illustrated in FIG. 2. This amplifier amplifies a difference between the drain voltage IOREFR of the NMOS transistor 56C and the drain voltage IOR[0] (or IOR[1]) of the NMOS transistor 64C to produce a resultant signal voltage. This resultant signal voltage goes through the inverter 67C to be output as OUTR[0] for the $0^{th}$ bit and OUTR[1] for the $1^{st}$ bit In the example illustrated in FIG. 19, the memory cell transistor 70-00 is selected for data reading in each of the cell arrays 22. The memory cell transistor 70-00 for the $0^{th}$ bit may store "1". In such a case, the cell current i[0] is equal to iCELL/2, so that the read data OUTR[0] is "1". The memory cell transistor 70-00 for the $1^{st}$ bit may store "0". In such a case, the cell current i[1] is very small, so that the read data OUTR[1] is "0".

It should be noted that the direction of a cell current flowing through a cell transistor in FIG. 19 is opposite the direction of a cell current flowing through a cell transistor illustrated in FIG. 5. In this case, the selected one of the plate lines PL[0] through PL[x] is set to HIGH (i.e., VDD), so that the cell current flows from the plate line to the ground through the selected cell transistor. The data read operation using such a reversed cell current as illustrated in FIG. 19 and the data read operation using a normal cell current as illustrated in FIG. 5 may be selectively performed in response to the reverse bit enable signal REVERSE applied to the timing generator 13C (see FIG. 18).

Figure 20A:
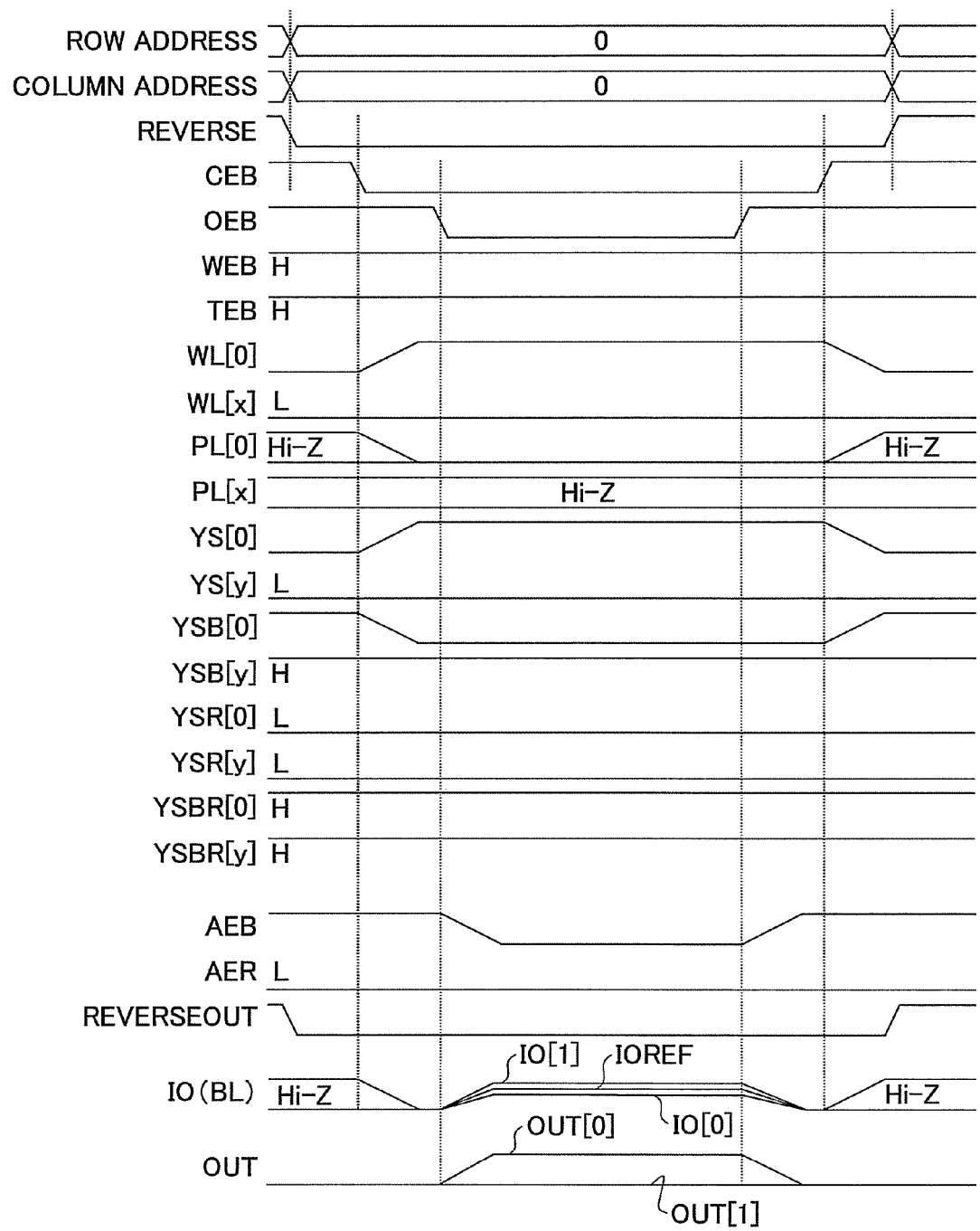
FIGS. 20A and 20B are timing charts illustrating examples of read operations of the nonvolatile memory device according to the second embodiment.
Figure 20B:
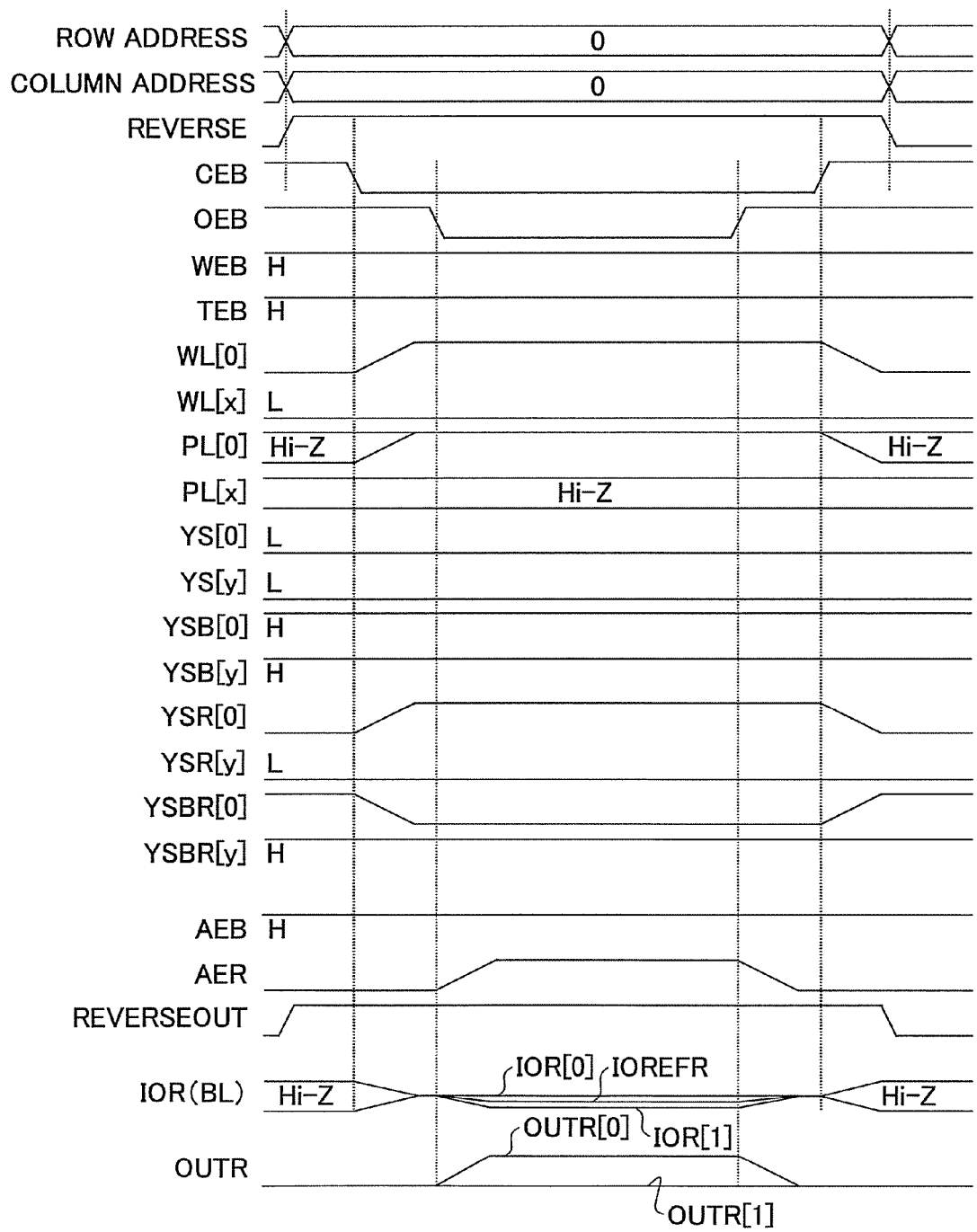

FIGS. 20A and 20B are timing charts illustrating examples of read operations of the nonvolatile memory device according to the second embodiment. FIG. 20A illustrates a data read operation utilizing a cell current flowing in a normal direction. FIG. 20B illustrates a data read operation utilizing a cell current flowing in a reversed direction. The row address to be accessed is "0", and the column address to be accessed is "0". The data read operation illustrated in FIG. 20A is similar to what is shown in FIG. 6, except that some additional signals such as REVERSE, YSR[0], YSR[y], YSBR[0], YSBR[y], AER, and REVERSEOUT are also illustrated. In FIG. 20A, the reverse bit enable signal REVERSE is set to LOW to indicate a normal read operation. The behaviors of the remaining signals are the same as those illustrated in FIG. 6.

In FIG. 20B, the reverse bit enable signal REVERSE is set to HIGH to indicate a reversed-direction read operation. In response to the reverse bit enable signal REVERSE being set to HIGH, the reverse output enable signal REVERSEOUT is set to HIGH. In response to a negative transition of the chip enable signal CEB, the word line WL[0] is changed to HIGH, and the plate line PL[0] is changed to HIGH. Further, the column select signals YSR[0] and YSBR[0] are changed to HIGH and LOW, respectively, to select a corresponding bit line. In response to a negative transition of the output enable signal OEB, the amplifier enable signal AER is changed to HIGH for assertion, which causes the reference amplifier 16C and the sense amplifiers 17C illustrated in FIG. 19 to be activated. Upon activation of the amplifiers, cell currents start flowing through the selected cell transistors, so that voltages IOREFR, IOR[0], and IOR[1] at the input nodes of the amplifiers begin to appear. The voltage IOREFR at the input node of the reference amplifier 16C has a middle voltage. In this example, the voltage IOR[0] at the input node of the $0^{th}$-bit sense amplifier 17C has a high voltage, the voltage IOR[1] at the input node of the $1^{st}$-bit sense amplifier 17C has a low voltage. As a result, the read data OUTR[0] is "1", and the read data OUTR[1] is "0".

Figure 21:
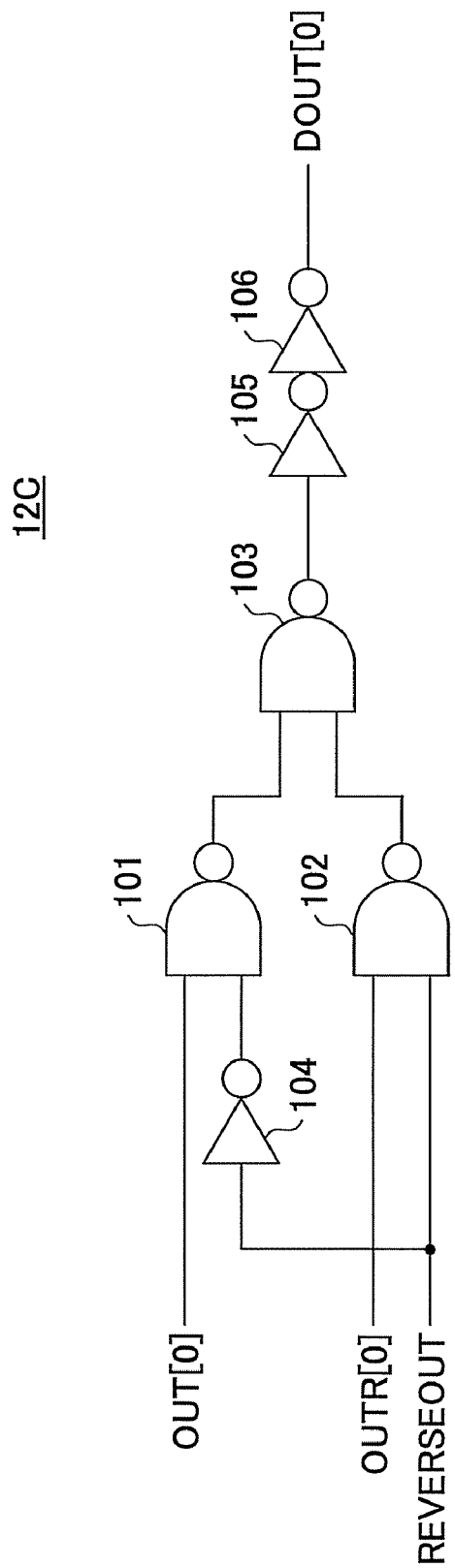
FIG. 21 is a drawing illustrating an example of the configuration of a DOUT buffer used in the nonvolatile memory device according to the second embodiment.

FIG. 21 is a drawing illustrating an example of the configuration of the DOUT buffer 12C used in the nonvolatile memory device according to the second embodiment. The DOUT buffer 12C of FIG. 21 includes NAND gates 101 through 103 and inverters 104 through 106. All the DOUT buffers 12C illustrated in FIG. 18 have the same configuration illustrated in FIG. 21. In the example illustrated in FIG. 21, the DOUT buffer 12C corresponds to the $0^{th}$ bit, and receives the read data OUT[0] for the normal read operation and the read data OUTR[0] for the reversed-direction read operation. When the reverse output enable signal REVERSEOUT is HIGH, the read data OUTR[0] is output as the output data DOUT[0]. When the reverse output enable signal REVERSEOUT is LOW, the read data OUT[0] is output as the output data DOUT[0].

Figure 22:
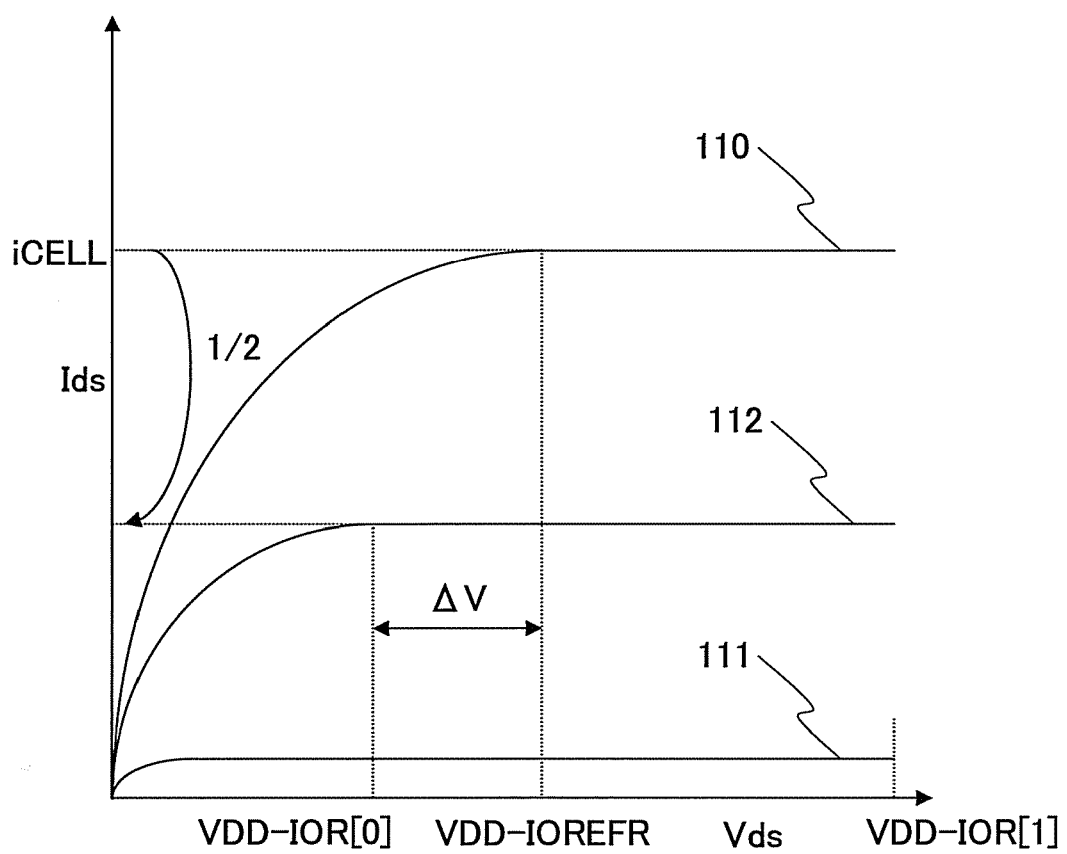
FIG. 22 is a drawing illustrating the Vds-Ids characteristics of a memory cell transistor when a reversed-direction data read operation is performed.

FIG. 22 is a drawing illustrating the Vds-Ids characteristics of a memory cell transistor when a reversed-direction data read operation is performed. A characteristic curve 110 represents the relationship between Vds and Ids of the reference cell transistor 60-0 illustrated in FIG. 19. A characteristic curve 111 represents the relationship between Vds and Ids of the memory cell transistor 70-00 that stores "0" in the $1^{st}$-bit cell array 22. A characteristic curve 112 represents the relationship between Vds and Ids of the memory cell transistor 70-00 that stores "1" in the $0^{th}$-bit cell array 22. It should be noted that the memory cell transistor 70-00 storing "1" and the reference cell transistor 60-0 have the same characteristics, but the gate-source voltage Vgs differs in the case of the reversed-direction data read operation. This is because the bit line is situated on the source side of the memory cell transistor in FIG. 19. Since the amount of current supplied to this memory cell transistor having "1" stored therein is half the saturation current iCELL, the drain-source voltage Vds decreases, which causes the bit line voltage to rise. As the voltage on the bit line rises, the gate-source voltage Vgs decreases, resulting in the Vds-Ids characteristic curve of the memory cell transistor changing from the characteristic curve 110 to the characteristic curve 112. When this happens, the difference between IOR[0] and IOREFR is ΔV as illustrated in FIG. 22. This voltage difference is smaller than the voltage difference that would be observed if the memory cell transistor sustained the characteristic curve 110. Such a small voltage difference may cause an erroneous or lengthy data read operation. In consideration of the above-noted problem, the amount of cell current used in the reversed-direction data read operation may be decreased compared to the amount of cell current used in the normal-direction data read operation.

Figure 23:
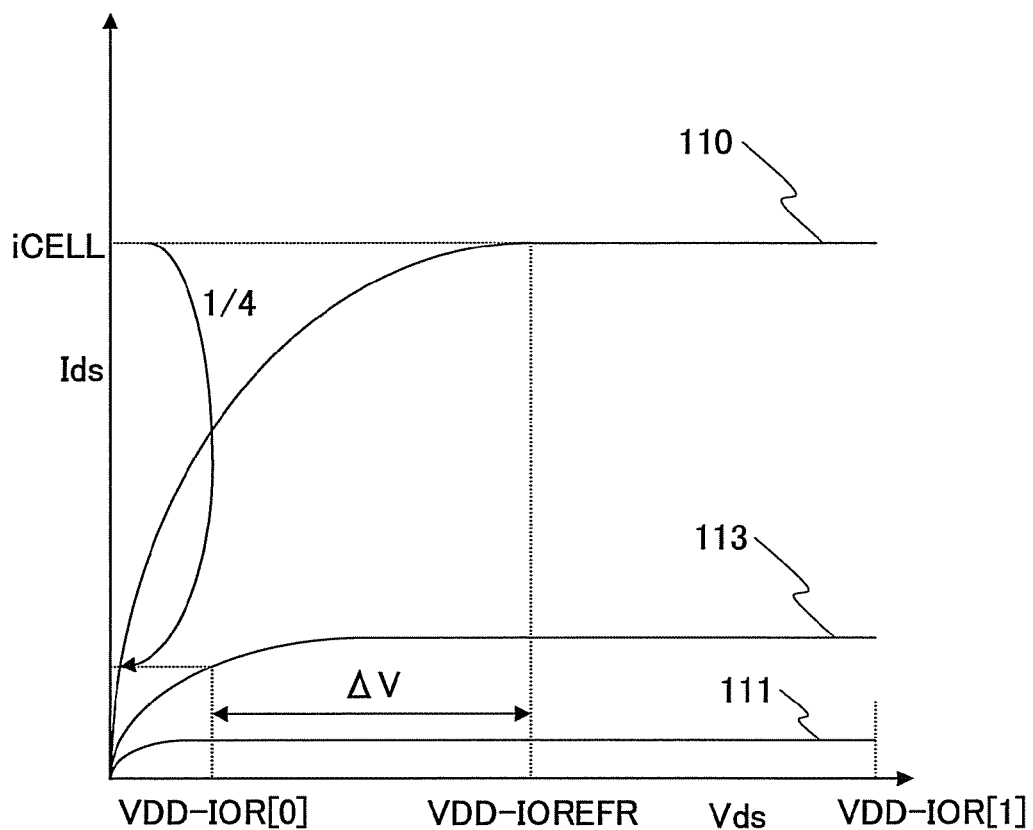
FIG. 23 is a drawing illustrating the Vds-Ids characteristics of a memory cell transistor when a cell current is decreased during a reversed-direction data read operation.

FIG. 23 is a drawing illustrating the Vds-Ids characteristics of a memory cell transistor when a cell current is decreased during a reversed-direction data read operation. In the case of the reversed-direction data read operation illustrated in FIG. 22, the amount of cell current supplied to the memory cell transistor is half the saturation current iCELL. In the case of the reversed-direction data read operation illustrated in FIG. 23, the amount of cell current supplied to the memory cell transistor is one-fourth of the saturation current iCELL. This current reduction further reduces the gate-source voltage Vgs compared to the case of FIG. 22. As Vgs drops, the Vds-Ids characteristic curve of the memory cell transistor changes from the characteristic curve 112 shown in FIG. 22 to the characteristic curve 113 shown in FIG. 23. Since the amount of cell current is only one forth of the saturation current iCELL, however, the voltage difference ΔV between IOR[0] and IOREFR illustrated in FIG. 23 is larger than the voltage difference ΔV illustrated in FIG. 22. This ensures a correct, prompt data sense operation.

In order to provide such a reduced cell current, the reference amplifier 16C illustrated in FIG. 19 may be modified to have an analogous configuration to the reference amplifier 16B illustrated in FIG. 9. With the provision of additional current source transistors, the modified reference amplifier 16C produces a cell current that may be ⅓, ¼, . . . , or 1/(m+1) of the saturation current iCELL.

Figure 24:
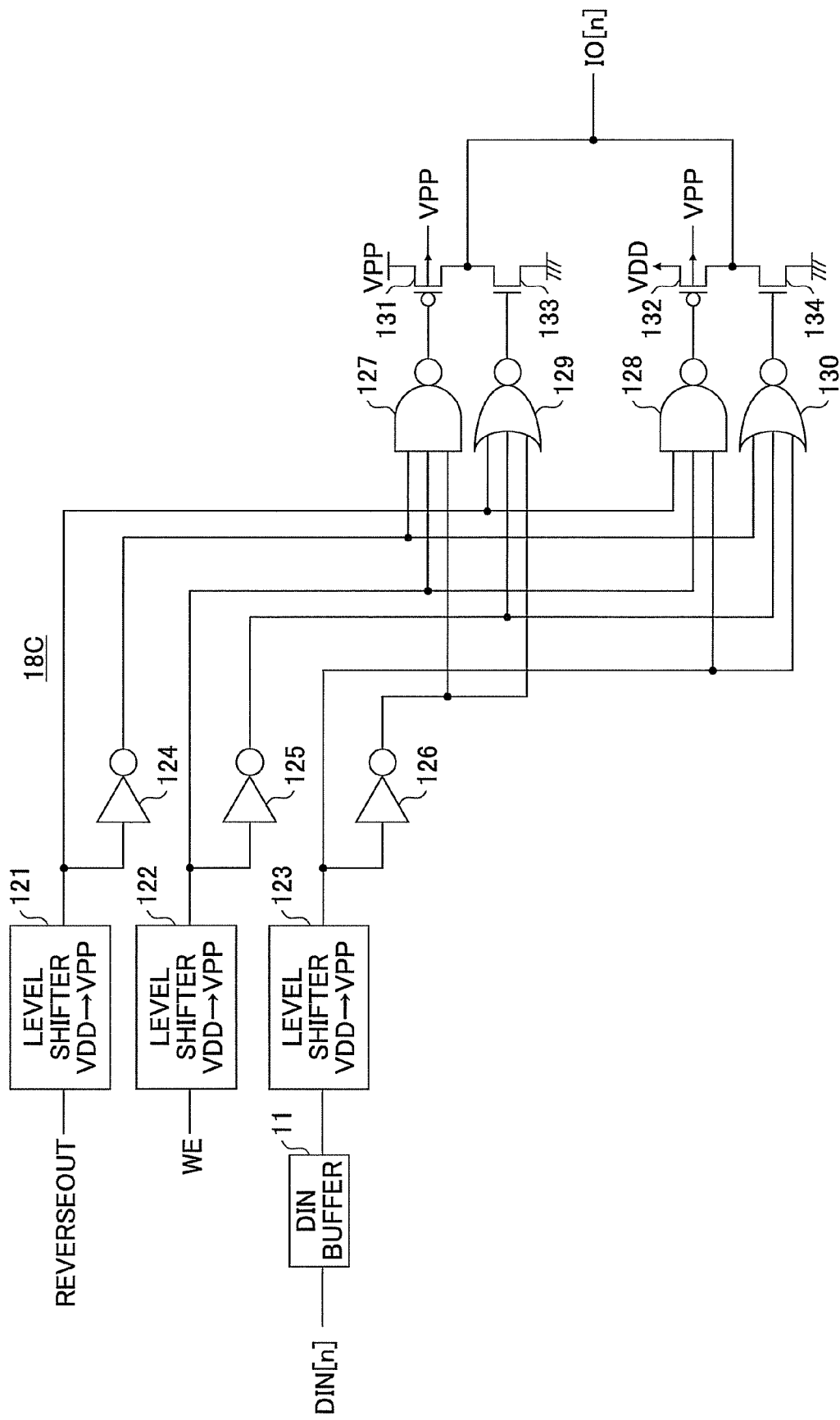
FIG. 24 is a drawing illustrating an example of the configuration of the write buffer used in the nonvolatile memory device according to the second embodiment.

FIG. 24 is a drawing illustrating an example of the configuration of the write buffer 18C used in the nonvolatile memory device according to the second embodiment. The write buffer 18C of FIG. 24 includes level shifters 121 through 123, inverters 124 through 127, NAND gates 127 and 128, NOR gates 129 and 130, PMOS transistors 131 and 132, and NMOS transistors 133 and 134. All the write buffers 18C illustrated in FIG. 18 have the same configuration illustrated in FIG. 24. In the example illustrated in FIG. 24, the write buffer 18C corresponds to the $n^{th}$ bit, and receives the write data DIN[n] via the DIN buffer 11.

The level shifter 121 receives the reverse output enable signal REVERSEOUT, and outputs a signal having the same logic as REVERSEOUT after shifting the signal level from VDD to VPP (i.e., extra HIGH). The level shifter 121 receives the write enable signal WE, and outputs a signal having the same logic as WE after shifting the signal from VDD to VPP. The level shifter 123 receives the input data DIN[n], and outputs a signal having the same logic as DIN[n] after shifting the signal level from VDD to VPP. The PMOS transistor 131 and the NMOS transistor 133 together serve as a driver circuit to produces a write voltage IO[n], which is VPP for data "0" and VSS for data "1". This driver circuit is used when REVERSEOUT is LOW. The PMOS transistor 132 and the NMOS transistor 134 together serve as a driver circuit to produces a write voltage IO[n], which is VDD for data "1" and VSS for data "0". This driver circuit is used when REVERSEOUT is HIGH.

FIG. 25 is a drawing showing a logic table defining the operation of the write buffer 18C illustrated in FIG. 24. As shown in FIG. 25, the output of the write buffer 18C is valid when the write enable signal WE is HIGH. When REVERSEOUT is LOW, a data write operation that stores data intended for a reversed-direction data read operation is performed. In this case, the output of the write buffer 18C, i.e., the voltage on the bit line, is set to VPP for data "0" and VSS for data "1". It should be noted that the direction of current during the data write operation is the normal direction in this case, i.e., from the bit line to the plate line. When REVERSEOUT is HIGH, a data write operation that stores data intended for a normal-direction data read operation is performed. In this case, the output of the write buffer 18C, i.e., the voltage of the bit line, is set to VSS for data "0" and VDD for data "1". It should be noted that the direction of current during the data write operation is the reversed direction in this case, i.e., from the plate line to the bit line.

Figure 26A:
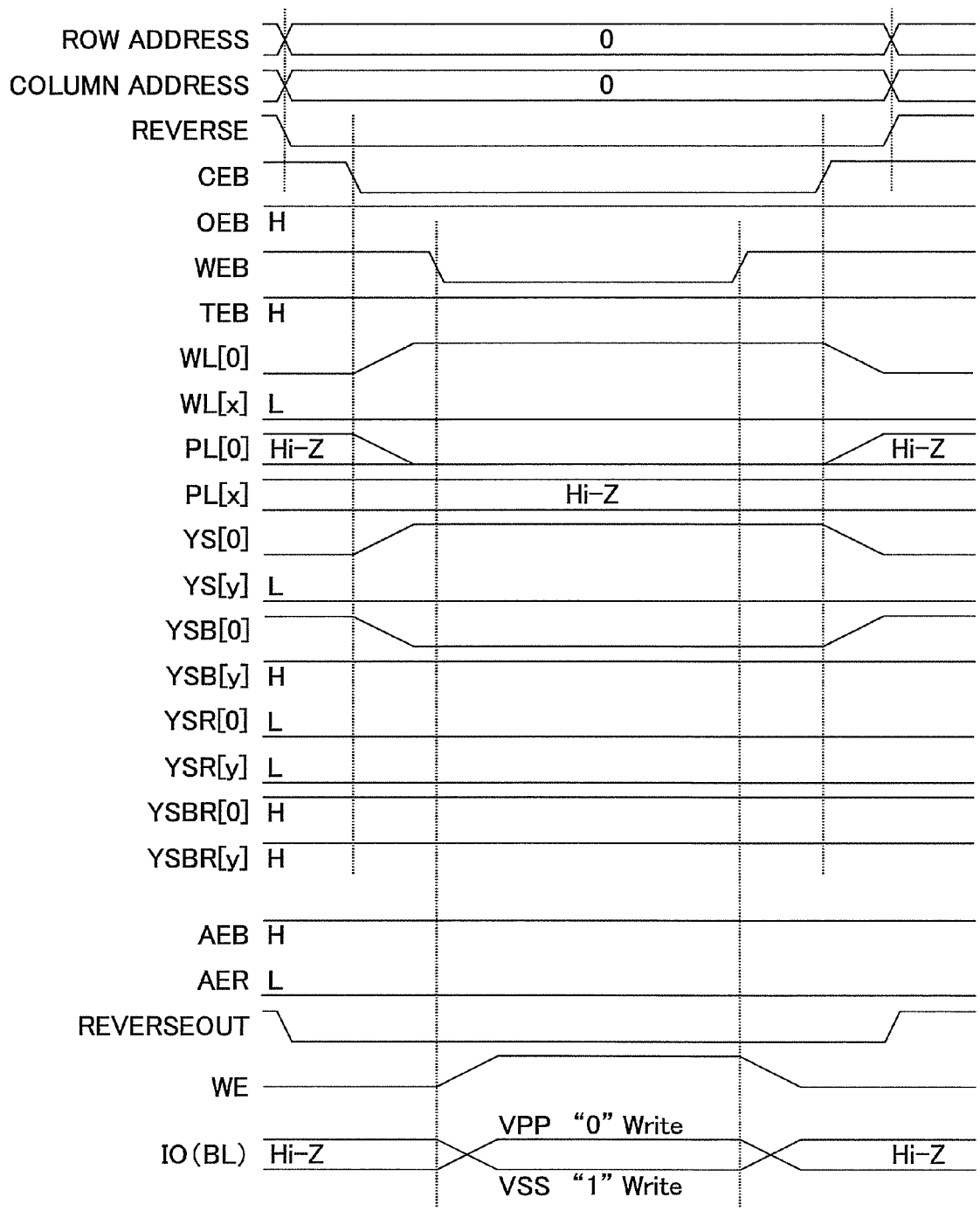
FIGS. 26A and 26B are timing charts illustrating examples of write operations of the nonvolatile memory device according to the second embodiment.
Figure 26B:
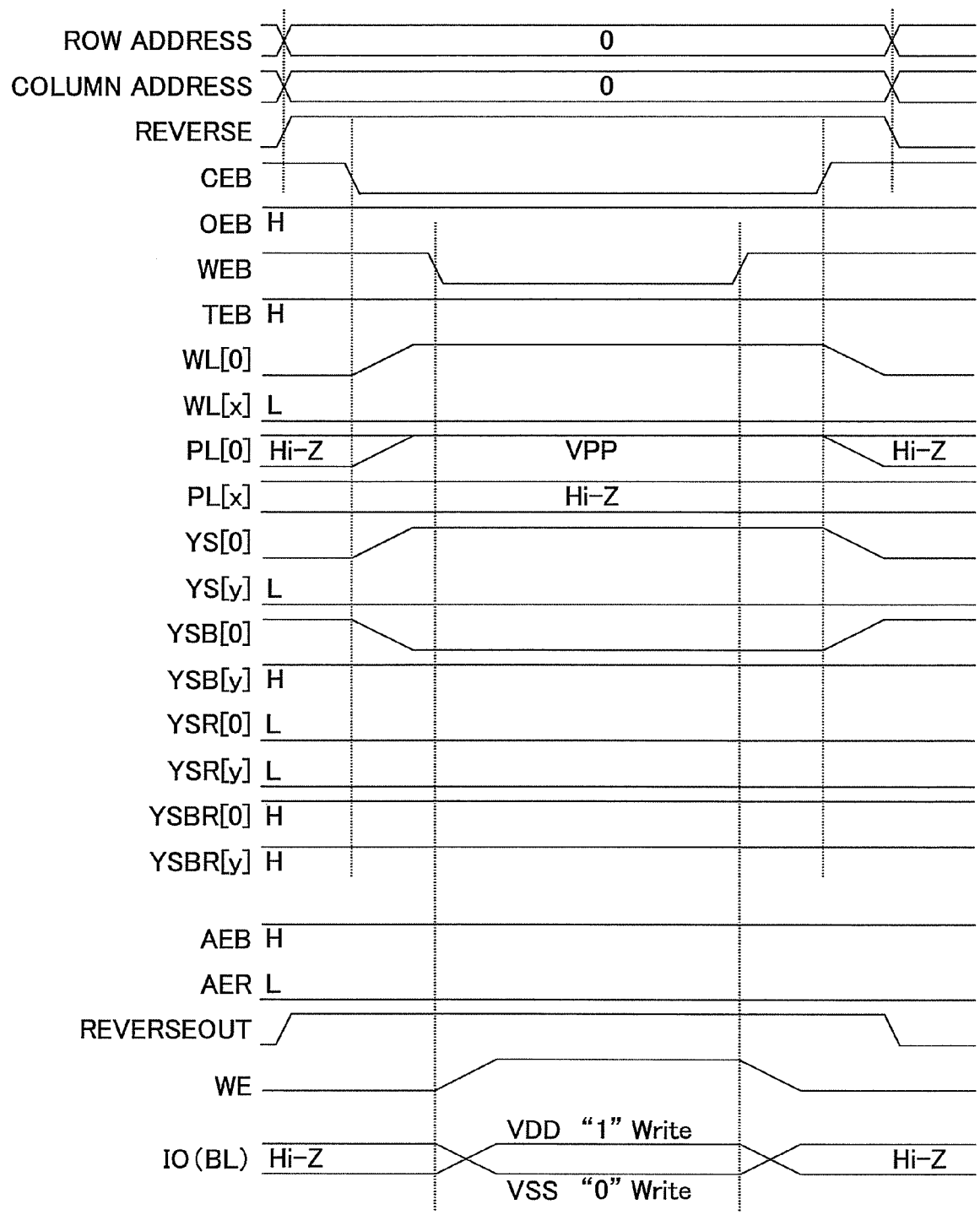

FIGS. 26A and 26B are timing charts illustrating examples of write operations of the nonvolatile memory device according to the second embodiment. FIG. 26A illustrates a data write operation intended for a data read operation utilizing a cell current flowing in the reversed direction. FIG. 26B illustrates a data write operation intended for a data read operation utilizing a cell current flowing in the normal direction. The row address to be accessed is "0", and the column address to be accessed is "0".

In FIG. 26A, the reverse bit enable signal REVERSE is set to LOW to indicate a normal-direction data write operation intended for a reversed-direction data read operation. In response to the reverse bit enable signal REVERSE being set to LOW, the reverse output enable signal REVERSEOUT is set to LOW. In response to a negative transition of the chip enable signal CEB, the word line WL[0] is changed to HIGH (i.e., VDD), and the plate line PL[0] is changed to LOW (i.e., VSS). Further, the column select signals YSR[0] and YSBR [0] are changed to HIGH and LOW, respectively, to select a corresponding bit line. The output enable signal OEB is sustained at HIGH during a data write operation. In response to a negative transition of the external write enable signal WEB, the internal write enable signal WE is changed to HIGH. The voltage IO(BL) of a bit line of interest is set to VPP for the writing of input data "0" and to VSS for the writing of input data "1".

In FIG. 26B, the reverse bit enable signal REVERSE is set to HIGH to indicate a reversed-direction data write operation intended for a normal-direction data read operation. In response to the reverse bit enable signal REVERSE being set to HIGH, the reverse output enable signal REVERSEOUT is set to HIGH. In response to a negative transition of the chip enable signal CEB, the word line WL[0] is changed to HIGH (i.e., VDD), and the plate line PL[0] is changed to extra HIGH (i.e., VPP). Further, the column select signals YSR[0] and YSBR[0] are changed to HIGH and LOW, respectively, to select a corresponding bit line. The output enable signal OEB is sustained at HIGH during a data write operation. In response to a negative transition of the external write enable signal WEB, the internal write enable signal WE is changed to HIGH. The voltage IO(BL) of a bit line of interest is set to VSS for the writing of input data "0" and to VDD for the writing of input data "1".

Further, the present invention is not limited to these embodiments, but various variations and modifications may be made without departing from the scope of the present invention.

What is claimed is:

1. A nonvolatile memory device, comprising:
   one or more reference cell transistors;
   one or more memory cell transistors; and
   a current source circuit including three or more field effect transistors that have gates thereof connected together, the three or more field effect transistors including two or more field effect transistors and another field effect transistor, currents flowing through the two or more field effect transistors being combined to flow through the one or more reference cell transistors, and said another field effect transistor having a drain thereof connected to one of the one or more memory cell transistors,
   wherein the current source circuit further includes two or more additional field effect transistors having two or more gates thereof connected to the gates of the three or more field effect transistors, and some of the two or more additional field effect transistors are selected in response to a code applied to the nonvolatile memory device from an external source, currents flowing through the selected some of the two or more additional field effect transistors being combined with the currents flowing through the two or more field effect transistors to flow through the one or more reference cell transistors.

2. The nonvolatile memory device as claimed in claim 1, wherein the two or more field effect transistors have drains thereof connected to the gates thereof, and the drain of said another field effect transistor is not connected to the gate of said another field effect transistor.

3. The nonvolatile memory device as claimed in claim 1, further comprising an amplifier to amplify a difference between a voltage at the drains of the two or more field effect transistors and a voltage at the drain of said another field effect transistor.

4. The nonvolatile memory device as claimed in claim 1, wherein a number of the two or more field effect transistors is larger than a number of the one or more reference cell transistors.

5. The nonvolatile memory device as claimed in claim 1, wherein the current source circuit is configured such that the currents flowing through the two or more field effect transistors are combined to flow through a single one of the one or more reference cell transistors.

6. The nonvolatile memory device as claimed in claim 1, wherein the memory cell transistors are flash memory transistors.

7. The nonvolatile memory device as claimed in claim 1, wherein each of the memory cell transistors is an MIS transistor which is configured such that electrons are deliberately trapped for a data storage purpose in an insulating film or sidewalls of the MIS transistor.

8. A nonvolatile memory device, comprising:
   one or more reference cell transistors;
   one or more memory cell transistors;
   a current source circuit including three or more field effect transistors that have gates thereof connected together, the three or more field effect transistors including two or more field effect transistors and another field effect transistor, currents flowing through the two or more field effect transistors being combined to flow through the one or more reference cell transistors, and said another field effect transistor having a drain thereof connected to one of the one or more memory cell transistors, wherein each of the memory cell transistors is an MIS transistor which is configured such that electrons are deliberately trapped for a data storage purpose in an insulating film or sidewalls of the MIS transistor; and
   a circuit configured to apply voltages to a selected one of the memory cell transistors in a first mode such that electrons are trapped selectively in a first one of the sidewalls, and to apply voltages to a selected one of the memory cell transistors in a second mode such that electrons are trapped selectively in a second one of the sidewalls.

9. The nonvolatile memory device as claimed in claim 8, further comprising:
   a row decoder configured to apply a first voltage to a gate of the selected one of the memory cell transistors and apply a second voltage lower than the first voltage to gates of the remaining ones of the memory cell transistors, and further configured to apply a third voltage higher than the first voltage to a first end of a channel of the selected one of the memory cell transistors in the first mode and apply the second voltage to the first end of the channel of the selected one of the memory cell transistors in the second mode; and
   a write buffer configured to supply the second voltage to a second end of the channel of the selected one of the memory cell transistors in the first mode for storage of data "0" and apply the third voltage to the second end of the channel of the selected one of the memory cell transistors in the second mode for storage of data "0".

10. The nonvolatile memory device as claimed in claim 9, wherein the write buffer is further configured to supply the first voltage to the second end of the channel of the selected one of the memory cell transistors in the first mode for storage of data "1" and apply the second voltage to the second end of the channel of the selected one of the memory cell transistors in the second mode for storage of data "1".

11. The nonvolatile memory device as claimed in claim 8, wherein the three or more field effect transistors of the current source circuit are field effect transistors of a first conduction type, and are used to detect whether electrons are trapped in the first one of the sidewalls, and wherein the current source circuit further includes three or more field effect transistors of a second conduction type that have gates thereof connected together, the three or more field effect transistors of the second conduction type including two or more field effect transistors of the second conduction type and another field effect transistor of the second conduction type, currents flowing through the two or more field effect transistors of the second conduction type being combined to flow through the one or more reference cell transistors, another field effect transistor of the second conduction type having a drain thereof connected to one of the one or more memory cell transistors, and the three or more field effect transistors of the second conduction type being used to detect whether electrons are trapped in the second one of the sidewalls.

12. The nonvolatile memory device as claimed in claim 8, wherein the current source circuit is configured such that currents flow in a first direction through the memory cell transistors when detecting whether electrons are trapped in the first one of the sidewalls, and such that currents flow in a second direction opposite the first direction through the memory cell transistors when detecting whether electrons are trapped in the second one of the sidewalls.

* * * * *